US007709942B2

(12) United States Patent
Jobetto

(10) Patent No.: US 7,709,942 B2
(45) Date of Patent: May 4, 2010

(54) SEMICONDUCTOR PACKAGE, INCLUDING CONNECTED UPPER AND LOWER INTERCONNECTIONS

(75) Inventor: Hiroyasu Jobetto, Hachioji (JP)

(73) Assignees: Casio Computer Co., Ltd., Tokyo (JP); CMK Corporation, Tokyo (JP)

( * ) Notice: Subject to any disclaimer, the term of this patent is extended or adjusted under 35 U.S.C. 154(b) by 23 days.

(21) Appl. No.: 10/860,478

(22) Filed: Jun. 2, 2004

(65) Prior Publication Data
US 2004/0245614 A1 Dec. 9, 2004

(30) Foreign Application Priority Data
Jun. 3, 2003 (JP) ............... 2003-158489

(51) Int. Cl.
*H01L 23/02* (2006.01)
(52) U.S. Cl. .................. 257/686; 257/E23.125; 257/E23.178
(58) Field of Classification Search ........... 257/686, 257/E23.125, E23.178
See application file for complete search history.

(56) References Cited
U.S. PATENT DOCUMENTS

| 5,337,027 | A | 8/1994 | Namordi et al. |
| 5,744,758 | A | 4/1998 | Takenochi et al. |
| 5,875,100 | A | 2/1999 | Yamashita |
| 6,222,259 | B1 * | 4/2001 | Park et al. ............ 257/690 |
| 6,479,760 | B2 | 11/2002 | Kimbara et al. |
| 6,486,005 | B1 | 11/2002 | Kim |
| 6,525,414 | B2 | 2/2003 | Shiraishi et al. |
| 6,528,871 | B1 | 3/2003 | Tomita |
| 6,538,210 | B2 * | 3/2003 | Sugaya et al. ......... 174/258 |
| 6,590,257 | B2 | 7/2003 | Ohuchi |
| 6,590,291 | B2 * | 7/2003 | Akagawa ............. 257/774 |
| 6,680,529 | B2 | 1/2004 | Chen et al. |
| 6,770,971 | B2 | 8/2004 | Kouno et al. |
| 6,952,049 | B1 | 10/2005 | Ogawa et al. |
| 7,279,750 | B2 | 10/2007 | Jobetto |
| 7,294,922 | B2 * | 11/2007 | Jobetto et al. ......... 257/700 |
| 2001/0004130 | A1 | 6/2001 | Higashi et al. |
| 2001/0010627 | A1 | 8/2001 | Akagawa |
| 2002/0017710 | A1 | 2/2002 | Kurashima et al. |
| 2002/0053730 | A1 | 5/2002 | Mashino |
| 2002/0117743 | A1 | 8/2002 | Nakatani et al. |
| 2002/0132461 | A1 * | 9/2002 | Kizaki ............ 438/612 |
| 2002/0175402 | A1 | 11/2002 | McCormack et al. |

(Continued)

FOREIGN PATENT DOCUMENTS
EP 1 111 674 A2 6/2001

(Continued)

Primary Examiner—Howard Weiss
(74) Attorney, Agent, or Firm—Frishauf, Holtz, Goodman & Chick, P.C.

(57) ABSTRACT

A semiconductor package includes a base plate, at least one semiconductor constructing body which is formed on one surface of the base plate and has a plurality of external connection electrodes formed on a semiconductor substrate, an insulating layer which is formed on one surface of the base plate around the semiconductor constructing body, upper interconnections which are formed on the insulating layer and each includes at least one interconnection layer, at least some of the upper interconnections are connected to the external connection electrodes of the semiconductor constructing body, lower interconnections which are formed on the other surface of the base plate and each includes at least one interconnection layer, and at least some of the lower interconnections which are electrically connected to the upper interconnections.

41 Claims, 25 Drawing Sheets

U.S. PATENT DOCUMENTS

| | | |
|---|---|---|
| 2002/0187588 A1 | 12/2002 | Omiza et al. |
| 2002/0195700 A1 | 12/2002 | Li |
| 2003/0062624 A1 | 4/2003 | Asahi et al. |
| 2003/0230804 A1* | 12/2003 | Kouno et al. ................ 257/734 |
| 2004/0056344 A1 | 3/2004 | Ogawa et al. |
| 2004/0150095 A1 | 8/2004 | Fraley et al. |
| 2004/0201085 A1 | 10/2004 | Ogawa et al. |
| 2005/0110116 A1 | 5/2005 | Ishio et al. |
| 2005/0121781 A1 | 6/2005 | Shizuno |
| 2005/0140007 A1 | 6/2005 | Jobetto |
| 2005/0140021 A1 | 6/2005 | Wakisaka et al. |
| 2005/0161799 A1 | 7/2005 | Jobetto |
| 2007/0264754 A1 | 11/2007 | Jobetto |
| 2008/0006943 A1 | 1/2008 | Wakisaka et al. |
| 2008/0044944 A1 | 2/2008 | Wakisaka |

FOREIGN PATENT DOCUMENTS

| | | |
|---|---|---|
| JP | 10-100026 A | 4/1998 |
| JP | 11-265975 A | 9/1999 |
| JP | 2001-044641 A | 2/2001 |
| JP | 2001-094046 A | 4/2001 |
| JP | 2001-168128 A | 6/2001 |
| JP | 2001-217337 A | 8/2001 |
| JP | 2001-250836 A | 9/2001 |
| JP | 2001-274034 A | 10/2001 |
| JP | 2001-339165 A | 12/2001 |
| JP | 2002-270712 A | 9/2002 |
| JP | 2002-280485 A | 9/2002 |
| JP | 2002-368184 A | 12/2002 |
| JP | 2003-158239 A | 5/2003 |
| JP | 2003-188314 A | 7/2003 |
| JP | 2003-197849 A | 7/2003 |
| JP | 2003-273321 A | 9/2003 |
| JP | 2003-318361 A | 11/2003 |
| JP | 2004-071998 A | 3/2004 |

* cited by examiner

SEMICONDUCTOR PACKAGE, INCLUDING CONNECTED UPPER AND LOWER INTERCONNECTIONS

CROSS-REFERENCE TO RELATED APPLICATIONS

This application is based upon and claims the benefit of priority from prior Japanese Patent Application No. 2003-158489, filed Jun. 3, 2003, the entire contents of which are incorporated herein by reference.

BACKGROUND OF THE INVENTION

1. Field of the Invention

The present invention relates to a semiconductor package having a semiconductor constructing body and a method of manufacturing the same.

2. Description of the Related Art

In recent years, semiconductor packages called CSPs (Chip Size Packages) have been developed as electronic devices represented by cellular phones reduce their sizes. In a CSP, for example, a passivation film (insulating film) is formed on the upper surface of a semiconductor substrate having an integrated circuit and a plurality of connection pads for external connection. Opening portions are formed in the passivation film in correspondence with the connection pads. Interconnections to be connected to the connection pads through the opening portions are formed. An external connection electrode made of, e.g., a columnar electrode is formed on the side of the other end portion of each interconnection. The space between the external connection electrodes is filled with a sealing material.

According to this CSP, for example, when solder balls are formed on the external connection electrodes, the device can be bonded to a circuit board with connection terminals by the face-down method. The mounting area can be almost the same as the size of the bare semiconductor package. The CSP can therefore greatly decrease the sizes of electronic devices as compared to the conventional face-up bonding method using wire bonding.

The conventional semiconductor package raises the following problems when the number of connection pads increases as the degree of integration becomes higher. As described above, a CSP normally has external connection electrodes arrayed in a matrix on the upper surface of a semiconductor substrate. When this array is used for a semiconductor substrate having many external connection electrodes, the size and pitch of the external connection electrodes become small. Because of this disadvantage, the CSP technology can hardly be applied to devices which have a large number of external connection electrodes relative to the size of the semiconductor substrate. More specifically, if the external connection electrodes have small size and pitch, alignment for connection to the circuit board becomes difficult, and the cost of connection to the circuit board increases. There are also problems that decrease the reliability, including a low bonding strength, a high probability of short circuit between electrodes in bonding, and a high probability of external connection electrode destruction which is caused by stress generated by the difference in coefficient of linear expansion between the semiconductor substrate and the circuit board.

In the conventional semiconductor package, as described above, the device can be bonded to a circuit board by the face-down method, and the mounting area can be almost the same as the size of the semiconductor substrate. For these reasons, the sizes of electronic devices can greatly be reduced as compared to the conventional face-up bonding method using wire bonding. However, even this method has a limitation on size reduction. More specifically, when other necessary circuit elements such as an inductor circuit element and antenna circuit element are formed on the circuit board, and the conventional semiconductor substrate is connected to these circuit elements to obtain a desired circuit function, the semiconductor substrate and circuit elements are arranged two-dimensionally. Hence, size reduction is limited. In addition, since these components are arranged two-dimensionally, the wiring length increases. This may increase the impedance (stray capacitance or the like), resulting in degradation in circuit characteristics.

BRIEF SUMMARY OF THE INVENTION

As an advantage of the present invention, in a semiconductor package including a semiconductor constructing body having a plurality of connection pads and a method of manufacturing the same, even when the number of connection pads of the semiconductor constructing body increases, connection terminals for external connection can have necessary size and pitch. Hence, the reliability of connection to a circuit board can be increased.

As another advantage, an electronic component using the semiconductor package can be made compact. In addition, since the wiring length between circuit elements can be decreased, the circuit characteristics can be improved.

In order to obtain the above effects, according to a first aspect of the present invention, there is provided a semiconductor package comprising at least a base plate, one or a plurality of semiconductor constructing bodies each of which is formed on one surface of the base plate and has a plurality of external connection electrodes formed on a semiconductor substrate, an insulating layer which is formed on one surface of the base plate around the semiconductor constructing bodies, upper interconnections each of which is formed on the insulating layer and includes at least one interconnection layer, at least some of the upper interconnections being connected to the external connection electrodes of the semiconductor constructing bodies, at least one connection terminal portion which is formed on the upper interconnection and has a projecting electrode including, e.g., a solder ball, an upper insulating film which covers an upper surface of the insulating film and portions except the connection terminal portions of the upper interconnections, lower interconnections each of which is formed on the other surface of the base plate and includes at least one interconnection layer, at least some of the lower interconnections being electrically connected to the upper interconnections, a lower insulating film which covers the other surface of the base plate and portions except the connection terminal portions of the lower interconnections, and a vertical conducting portion which connects one of the interconnection layers of the upper interconnection to one of the interconnection layers of the lower interconnection, wherein, e.g., an electronic component is mounted on the lower insulating film or upper insulating film and connected to the connection terminal portions, or a thin-film circuit element such as a capacitor circuit element, inductor circuit element, or antenna circuit element is formed by some of the lower interconnections or some of the upper interconnections.

In order to obtain the above effects, according to a second aspect of the present invention, there is also provided a method of manufacturing a semiconductor package, comprising arranging, on one surface of a base plate, a plurality of semiconductor constructing bodies each having a plurality of external connection electrodes formed on a semiconductor substrate while separating the semiconductor constructing bodies from each other, forming an insulating layer on one surface of the base plate around the semiconductor constructing bodies, forming, over the insulating layer, upper interconnections each of which includes at least one interconnection layer and has at least one connection terminal portion, at least some of the upper interconnections being connected to the external connection electrodes of the semiconductor constructing bodies, forming, over the insulating layer and the upper interconnections, an upper insulating film which covers portions except the connection terminal portions, forming, over the other surface of the base plate, lower interconnections each of which includes at least one interconnection layer and at least one connection terminal portion, forming a lower insulating film which covers the other surface of the base plate and portions except the connection terminal portions of the lower interconnections, forming a through hole in the insulating layer and the base plate, forming, in the through hole, a vertical conducting portion which connects one of the layers of the upper interconnection to one of the layers of the lower interconnection, and further comprising mounting, e.g., an electronic component on the upper insulating film or lower insulating film and connecting the electronic component to the connection terminal portions.

In order to obtain the above effects, according to a third aspect of the present invention, there is provided a semiconductor package comprising a first semiconductor package and a second semiconductor package, the first semiconductor package comprising at least a base plate, at least one semiconductor constructing body which is formed on one surface of the base plate and has a plurality of external connection electrodes formed on a semiconductor substrate, an insulating layer which is formed on one surface of the base plate around the semiconductor constructing body, and upper interconnections each of which is formed on the insulating layer and includes at least one interconnection layer, at least some of the upper interconnections being connected to the external connection electrodes of the semiconductor constructing body and having at least one connection terminal portion, and the second semiconductor package comprising at least a base plate, at least one semiconductor constructing body which is formed on one surface of the base plate and has a plurality of external connection electrodes formed on a semiconductor substrate, an insulating layer which is formed on one surface of the base plate around the semiconductor constructing body, upper interconnections each of which is formed on the insulating layer and includes at least one interconnection layer, at least some of the upper interconnections being connected to the external connection electrodes of the semiconductor constructing body and having at least one connection terminal portion, and lower interconnections each of which is formed on the other surface of the base plate and includes at least one interconnection layer, at least some of the lower interconnections being electrically connected to the upper interconnections and having at least one connection terminal portion, wherein one or a plurality of second semiconductor packages are connected to each other and stacked on the first semiconductor package, and the connection terminal portion of the lower interconnection of the semiconductor package on an upper side is connected to the connection terminal portion of the upper interconnection of the semiconductor package on a lower side by one of a connection portion between the first semiconductor package and the second semiconductor package stacked thereon and a connection portion between the plurality of second semiconductor packages stacked on each other via an adhesive layer having a through hole filled with a conductive material.

In order to obtain the above effects, according to the fourth aspect of the present invention, there is also provided a method of manufacturing a semiconductor package including a first semiconductor package and a second semiconductor package, the first semiconductor package including at least a base plate, at least one semiconductor constructing body which is formed on one surface of the base plate and has a plurality of external connection electrodes formed on a semiconductor substrate, an insulating layer which is formed on one surface of the base plate around the semiconductor constructing body, and upper interconnections each of which is formed on the insulating layer and includes at least one interconnection layer, at least some of the upper interconnections being connected to the external connection electrodes of the semiconductor constructing body and having at least one connection terminal portion, and the second semiconductor package including at least a base plate, at least one semiconductor constructing body which is formed on one surface of the base plate and has a plurality of external connection electrodes formed on a semiconductor substrate, an insulating layer which is formed on one surface of the base plate around the semiconductor constructing body, upper interconnections each of which is formed on the insulating layer and includes at least one interconnection layer, at least some of the upper interconnections being connected to the external connection electrodes of the semiconductor constructing body and having at least one connection terminal portion, and lower interconnections each of which is formed on the other surface of the base plate and includes at least one interconnection layer, at least some of the lower interconnections being electrically connected to the upper interconnections and having at least one connection terminal portion, comprising stacking one or a plurality of second semiconductor packages on the first semiconductor package and connecting the connection terminal portion of the lower interconnection of the semiconductor package on an upper side to the connection terminal portion of the upper interconnection of the semiconductor package on a lower side by one of a portion between the first semiconductor package and the second semiconductor package stacked thereon and a portion between the plurality of second semiconductor packages stacked on each other.

According to the semiconductor package of the present invention, the arrangement region of the connection terminal portions having projecting electrodes used for external connection can be made larger than the size of the semiconductor constructing body. Even when the number of connection pads of the semiconductor constructing body increases, the decrease in size and pitch of the connection terminal portions can be suppressed while ensuring a necessary size. Hence, the reliability of connection to a circuit board can be increased.

In addition, an electronic component or a thin-film circuit element can be mounted on the semiconductor package, or a plurality of semiconductor packages can be stacked on each other. Since an electronic component or a thin-film circuit element can integrally be mounted on the semiconductor constructing body, or a plurality of semiconductor constructing bodies can be mounted at a high density, size reduction of an electronic device using this semiconductor package can be promoted. In addition, since the wiring length between the semiconductor constructing body and a thin-film circuit element or electronic component or between the semiconductor constructing bodies can be decreased, the circuit characteristics can be improved.

DETAILED DESCRIPTION OF THE INVENTION

Semiconductor packages having semiconductor constructing bodies according to the present invention and methods of manufacturing the same will be described below in detail on the basis of embodiments shown in the accompanying drawings.

First Embodiment

Figure 1:
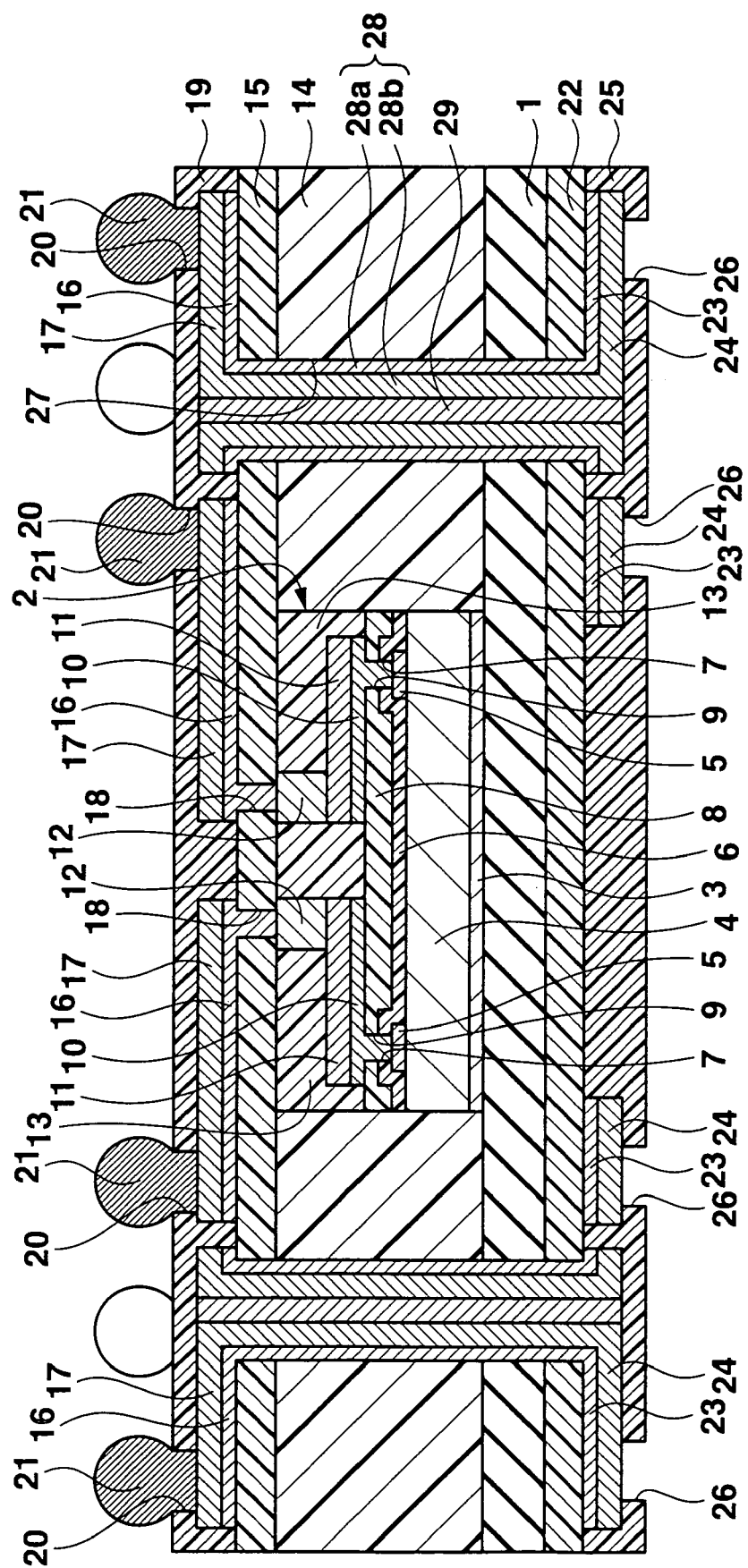
FIG. 1 is a sectional view showing a semiconductor package according to the first embodiment of the present invention.

FIG. 1 is a sectional view showing a semiconductor package according to the first embodiment of the present invention.

This semiconductor package has a base plate 1 having a rectangular planar shape. The base plate 1 is made of an insulating material prepared by impregnating glass fibers, aramid fibers, or liquid crystal fibers with epoxy resin, polyimide resin, BT (Bismaleimide Triazine) resin, or PPE (PolyPhenylene Ether). Alternatively, the base plate 1 may made of an insulating material such as silicon, glass, ceramic, or a single resin.

The lower surface of a semiconductor constructing body 2 which has a rectangular planar shape and is slightly smaller than the base plate 1 is bonded to the central portion of the upper surface (one surface) of the base plate 1 via an adhesive layer 3 made of a die bonding material. In this case, the semiconductor constructing body 2 has interconnections, columnar electrodes, and a sealing film (to be described later) and is generally called a CSP. The semiconductor constructing body 2 is also particularly called a wafer-level CSP (W-CSP) because a method of forming the interconnections, columnar electrodes, and sealing film on a silicon wafer and then executing dicing to obtain individual semiconductor constructing bodies 2 is employed, as will be described later.

The structure of the semiconductor constructing body 2 will be described below.

The semiconductor constructing body 2 has a silicon substrate (semiconductor substrate) 4. The silicon substrate 4 is bonded to the base plate 1 via the adhesive layer 3. An integrated circuit having a predetermined function is formed at the central portion of the upper surface of the silicon substrate 4. A plurality of connection pads 5 are formed at the peripheral portion on the upper surface. The connection pads 5 are made of an aluminum-based metal and electrically connected to the integrated circuit.

An insulating film 6 made of silicon oxide is formed on the upper surface of the silicon substrate 4 and the connection pads 5 except the central portion of each connection pad 5. The central portion of each connection pad 5 is exposed through an opening portion 7 formed in the insulating film 6.

A protective film (insulating film) 8 made of epoxy resin or polyimide resin is formed on the upper surface of the insulating film 6. In this case, opening portions 9 are formed in the protective film 8 at positions corresponding to the opening portions 7 of the insulating film 6. An underlying metal layer 10 made of copper extends from the upper surface of each connection pad 5 exposed through the opening portions 7 and 9 to a predetermined portion on the upper surface of the protective film 8.

Interconnections 11 made of copper are formed on the entire upper surfaces of the underlying metal layers 10, respectively.

A columnar electrode (external connection electrode) 12 made of copper is formed on the upper surface of the connection pad portion of each interconnection 11. A sealing film (insulating film) 13 made of epoxy resin or polyimide resin is formed around the columnar electrodes 12 and on the upper surface of the protective film 8 including the interconnections 11. The upper surface of the sealing film 13 is flush with those of the columnar electrodes 12. As described above, the semiconductor constructing body 2 called a W-CSP includes the silicon substrate 4, connection pads 5, and insulating film 6 and also includes the protective film 8, interconnections 11, columnar electrodes 12, and sealing film 13.

An insulating layer 14 having a rectangular frame shape is formed on the upper surface of the base plate 1 around the semiconductor constructing body 2. The upper surface of the insulating layer 14 is substantially flush with that of the semiconductor constructing body 2.

The insulating layer 14 is made of, e.g., a thermosetting resin or a material prepared by dispersing a reinforcing material such as glass fibers or silica fillers in a thermosetting resin.

A first upper insulating film 15 having a flat upper surface is formed on the upper surfaces of the semiconductor constructing body 2 and insulating layer 14. The first upper insulating film 15 is normally called a build-up material which is used for a build-up substrate. The first upper insulating film 15 is made of, e.g., a thermosetting resin such as epoxy resin or BT resin containing reinforcing materials such as fibers or fillers. In this case, the fiber is glass fiber or aramid fiber. The filler is silica filler or ceramic filler.

Upper underlying metal layers 16 made of copper are formed at predetermined portions on the upper surface of the first upper insulating film 15. An upper interconnection 17 made of copper is formed on the entire upper surface of each upper underlying metal layer 16. At least some of the upper underlying metal layers 16 including the upper interconnections 17 are electrically connected to the upper surfaces of the columnar electrodes 12 through opening portions 18 formed in the first upper insulating film 15 at portions corresponding to the central portions of the upper surfaces of the columnar electrodes 12.

A second upper insulating film 19 made of solder resist is formed on the upper surfaces of the first upper insulating films 15 and the upper interconnections 17.

An opening portion 20 is formed in the second upper insulating film 19 at a portion corresponding to the connection terminal portion of each upper interconnection 17. A solder ball 21 is formed in and above each opening portion 20 and electrically connected to the connection terminal portion of the upper interconnection 17. The plurality of solder balls 21 are arranged in a matrix on the second upper insulating film 19.

A first lower insulating film 22 having a flat lower surface is formed on the lower surface (other surface) of the base plate 1. The first lower insulating film 22 is made of, e.g., the same material as the first upper insulating film 15. Lower underlying metal layers 23 made of copper are formed at predetermined positions on the lower surface of the first lower insulating film 22. A lower interconnection 24 made of copper is formed on the entire lower surface of each lower underlying metal layer 23.

A second lower insulating film 25 made of solder resist is formed on the lower surfaces of the first lower insulating film 22 and the lower interconnections 24. An opening portion 26 is formed in the lower insulating film 25 at a portion corresponding to the connection terminal portion of each lower interconnection 24.

At least some of the upper underlying metal layers 16 including the upper interconnections 17 are electrically connected to the lower underlying metal layers 23 including the lower interconnections 24 through vertical conducting portions 28. Each of the portions 28 includes an underlying metal layer 28a made of copper and a copper layer 28b, which is formed on the inner surface of a through hole 27. The hole 27 formed in the insulating film 15, insulating layer 14, base plate 1, and the first lower insulating film 22 at a predetermined position. In this case, a cavity is formed in the copper layer 28b. Optionally, to obtain satisfactory electrical conduction between the upper and lower interconnections 17, 24, the cavity may be filled with a conductive material 29 such as copper paste, silver paste, or a conductive resin. Alternatively, the cavity portion may be filled with an insulating resin so as to increase the reliability by preventing invasion of any external impurities such as water into the semiconductor package.

In this embodiment, the size of the base plate 1 is larger than that of the semiconductor constructing body 2 to some extent. Accordingly, the arrangement region of the connection terminal portions of the upper interconnections 17 can be made larger than the size of the semiconductor constructing body 2 to some extent. Hence, the size and pitch of the connection terminal portions of the upper interconnections 17 (the portions in the opening portions 20 of the second upper insulating film 19) can be made larger than those of the columnar electrodes 12.

More specifically, the connection terminal portions of the upper interconnections 17 arranged in a matrix are arranged not only on a region corresponding to the semiconductor constructing body 2 but also on a region corresponding to the insulating layer 14 arranged outside the outer side surface of the semiconductor constructing body 2. Of the solder balls 21 arranged in a matrix on the second upper insulating film 19, at least the solder balls 21 at the outermost positions are arranged around the semiconductor constructing body 2. With this structure, even when the number of connection pads 5 on the silicon substrate 4 increases, the decrease in size and pitch of the solder balls 21 can be suppressed while ensuring a necessary size. Since alignment for connection to a circuit board is facilitated, the cost for connection to a circuit board can be decreased, and the reliability of connection to a circuit board can be increased.

In this semiconductor package, as described above, the lower interconnections 24 are formed under the first lower insulating films 22 formed under the base plate 1. The lower interconnections 24 are connected to at least some of the upper interconnections 17 through the vertical conducting portions 28 formed in the through holes 27 formed in the first upper insulating film 15, insulating layer 14, base plate 1, and first lower insulating film 22. As will be described later, for example, thin-film circuit elements such as capacitor circuit elements, inductor circuit elements, or antenna circuit elements may be formed by at least some of the lower interconnections 24. The thin-film circuit elements may be connected to the upper interconnections 17 through the vertical conducting portions 28. Alternatively, as will be described later, for example, chip components such as capacitors or resistors or electronic components such as IC chips may be mounted on the upper surface of the second lower insulating film 25. With this structure, size reduction of an electronic device using this semiconductor package can be promoted. In addition, since the wiring length between the semiconductor constructing body and a thin-film circuit element or an electronic component can be decreased, the circuit characteristics can be improved.

(Manufacturing Method)

An example of a method of manufacturing the semiconductor package will be described next. First, an example of a method of manufacturing the semiconductor constructing body applied to the semiconductor package will be described.

Figure 2:
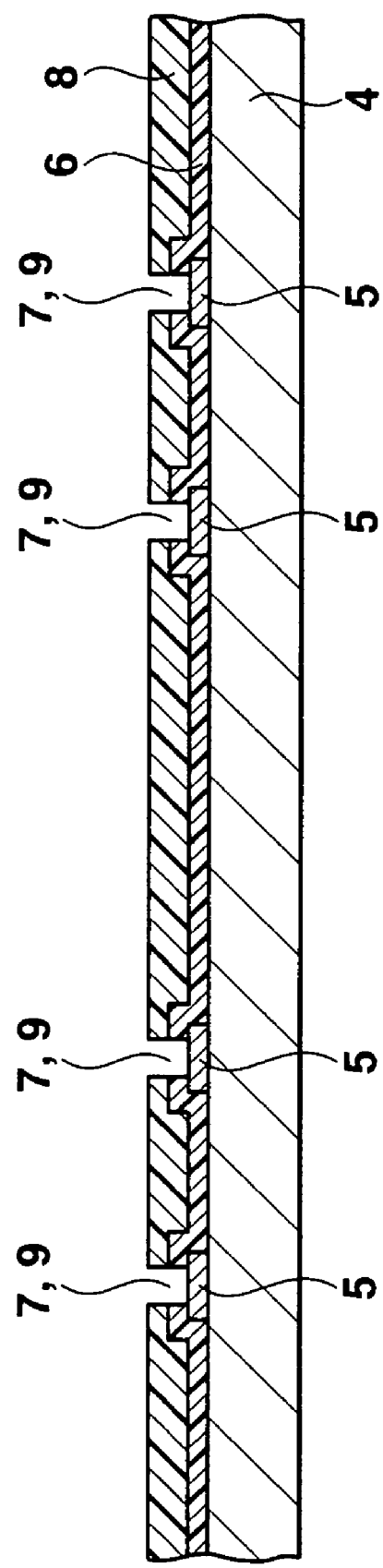
FIG. 2 is a sectional view showing an initially prepared structure in an example of a manufacturing method applied to the semiconductor package according to the first embodiment.

FIG. 2 is a sectional view showing an example of a method of manufacturing the semiconductor constructing body applied to the semiconductor package according to the first embodiment.

In this case, as shown in FIG. 2, a structure is prepared, in which the connection pads 5 made of an aluminum-based metal, the insulating film 6 made of silicon oxide, and the protective film 8 made of epoxy resin or polyimide resin are formed on the silicon substrate (semiconductor substrate) 4 in a wafer state. The central portions of the connection pads 5 are exposed through the opening portions 7 and 9 formed in the insulating film 6 and protective film 8. In the above structure, an integrated circuit having a predetermined function is formed in a region of each of the silicon substrates 4 in the wafer state, where each semiconductor constructing body should be formed. Each connection pad 5 is electrically connected to the integrated circuit formed in a corresponding region.

Figure 3:
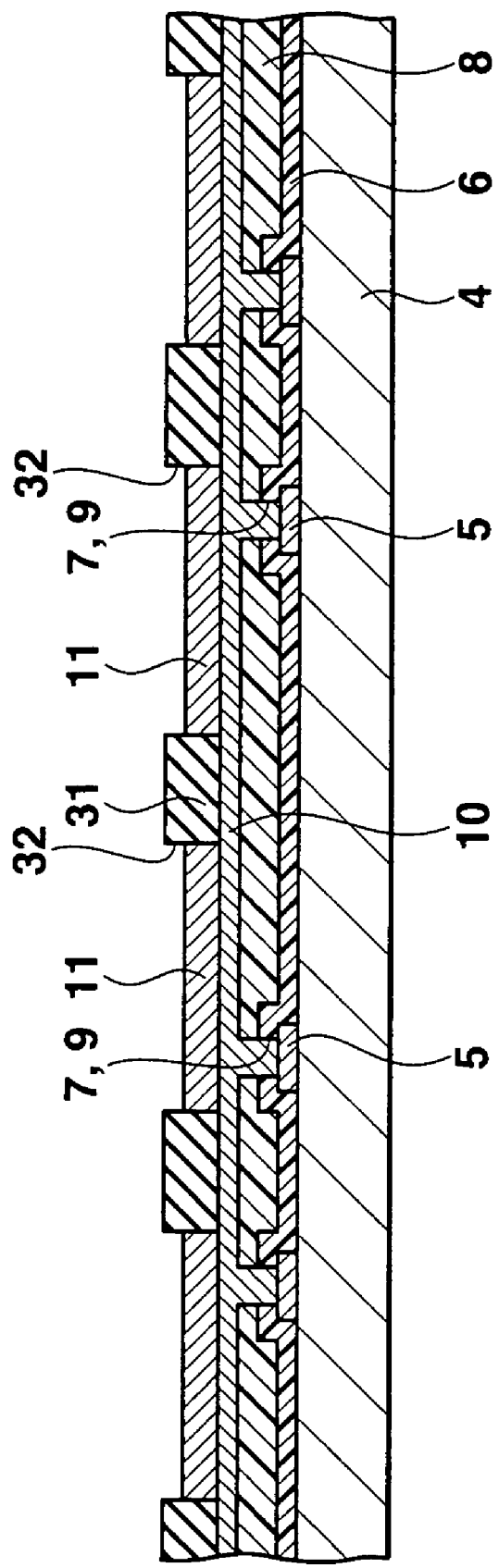
FIG. 3 is a sectional view showing a manufacturing step following FIG. 2.

Next, as shown in FIG. 3, the underlying metal layer 10 is formed on the entire upper surface of the protective film 8, including the upper surfaces of the connection pads 5 exposed through the opening portions 7 and 9. In this case, the underlying metal layer 10 may have only a copper layer formed by electroless plating or only a copper layer formed by sputtering. Alternatively, a copper layer may be formed by sputtering on a thin titanium layer formed by sputtering.

Next, a plating resist film 31 is formed on the upper surface of the underlying metal layer 10 and then patterned. In this case, the plating resist film 31 has an opening portion 32 at a position corresponding to the formation region of each interconnection 11.

Copper electroplating is executed using the underlying metal layer 10 as a plating current path to form the interconnection 11 on the upper surface of the underlying metal layer 10 in each opening portion 32 of the plating resist film 31. Then, the plating resist film 31 is removed.

Figure 4:
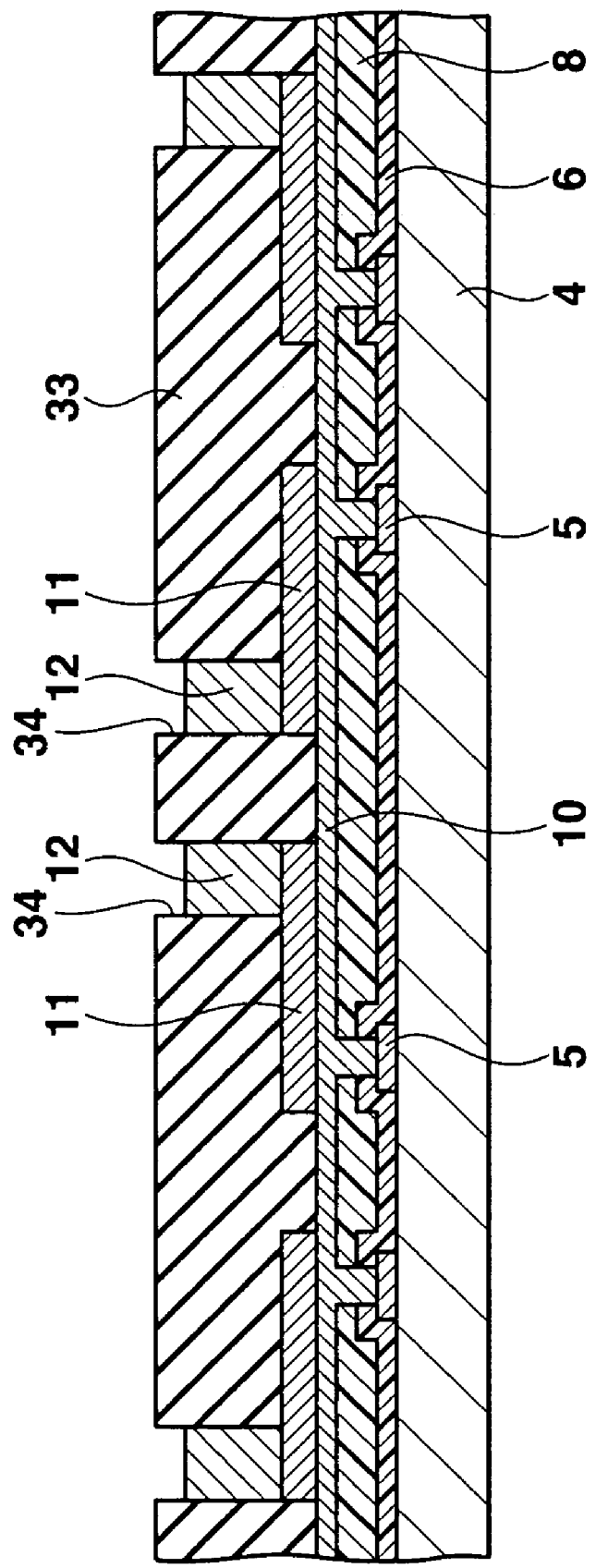
FIG. 4 is a sectional view showing a manufacturing step following FIG. 3.
Figure 5:
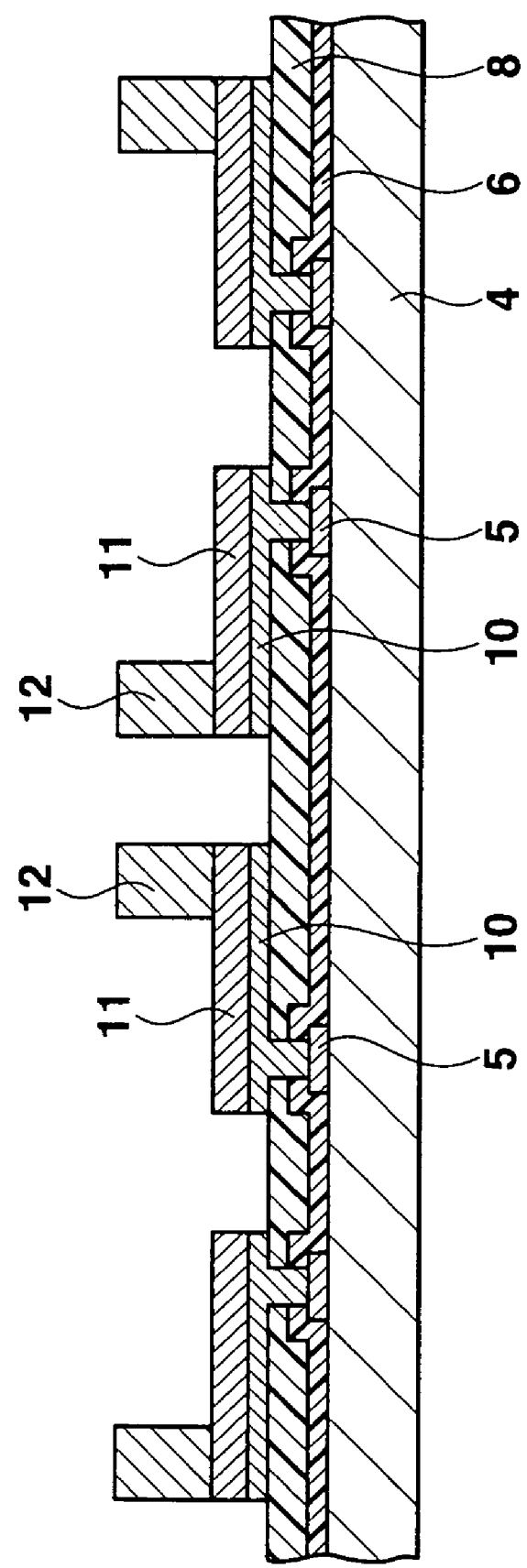
FIG. 5 is a sectional view showing a manufacturing step following FIG. 4.

As shown in FIG. 4, a plating resist film 33 formed and then patterned on the upper surface of the underlying metal layer 10 including the interconnections 11. In this case, the plating resist film 33 has an opening portion 34 at a position corresponding to the formation region of each columnar electrode 12. Copper electroplating is executed using the underlying metal layer 10 as a plating current path to form the columnar electrode 12 on the upper surface of the connection pad portion of the interconnection 11 in each opening portion 34 of the plating resist film 33. Thereafter, the plating resist film 33 is removed. Unnecessary portions of the underlying metal layer 10 are removed by etching using the interconnections 11 as a mask so that the underlying metal layers 10 are left only under the interconnections 11, as shown in FIG. 5.

Figure 6:
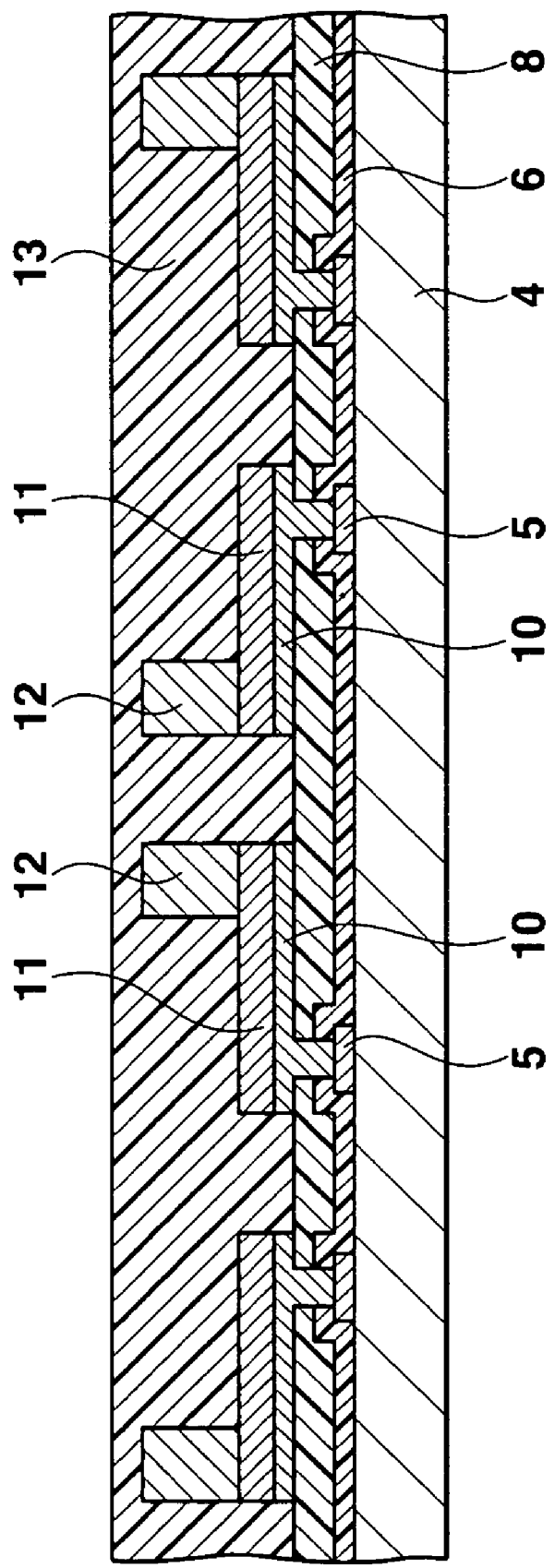
FIG. 6 is a sectional view showing a manufacturing step following FIG. 5.

As shown in FIG. 6, the sealing film 13 made of epoxy resin or polyimide resin is formed on the entire upper surface of the protective film 8 including the columnar electrodes. 12 and interconnections 11 by screen printing, spin coating, or die coating such that the film thickness is more than the height of the columnar electrodes 12. Hence, in this state, the upper surfaces of the columnar electrodes 12 are covered with the sealing film 13.

Figure 7:
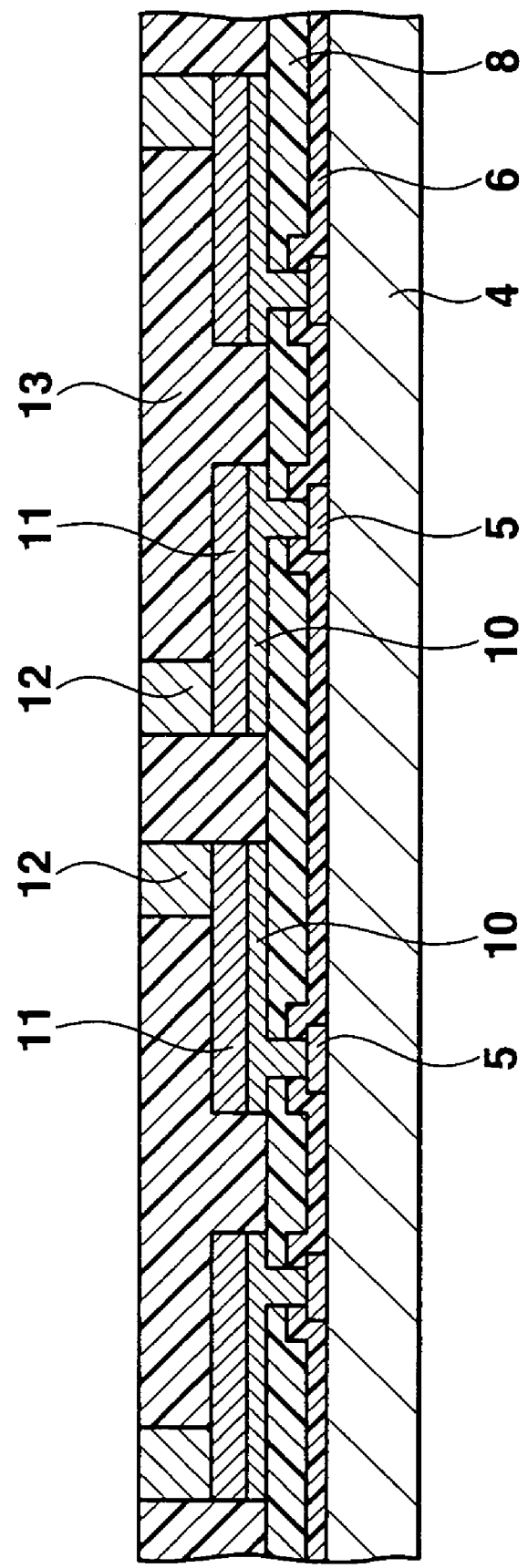
FIG. 7 is a sectional view showing a manufacturing step following FIG. 6.

The upper surfaces of the sealing film 13 and columnar electrodes 12 are appropriately polished to expose the upper surfaces of the columnar electrodes 12, as shown in FIG. 7. The upper surface of the sealing film 13 including the exposed upper surfaces of the columnar electrodes 12 is also planarized. The reason why the upper surface side of the columnar electrodes 12 is appropriately polished is that the heights of the columnar electrodes 12 formed by electroplating have a variation and need to be uniformed by canceling the variation.

Figure 8:
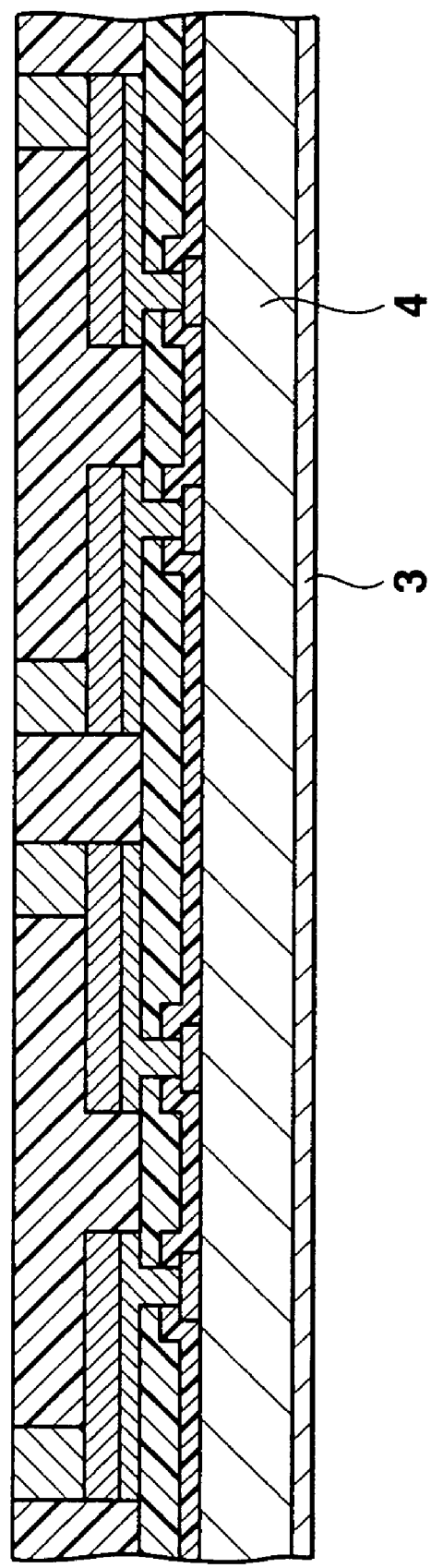
FIG. 8 is a sectional view showing a manufacturing step following FIG. 7.
Figure 9:
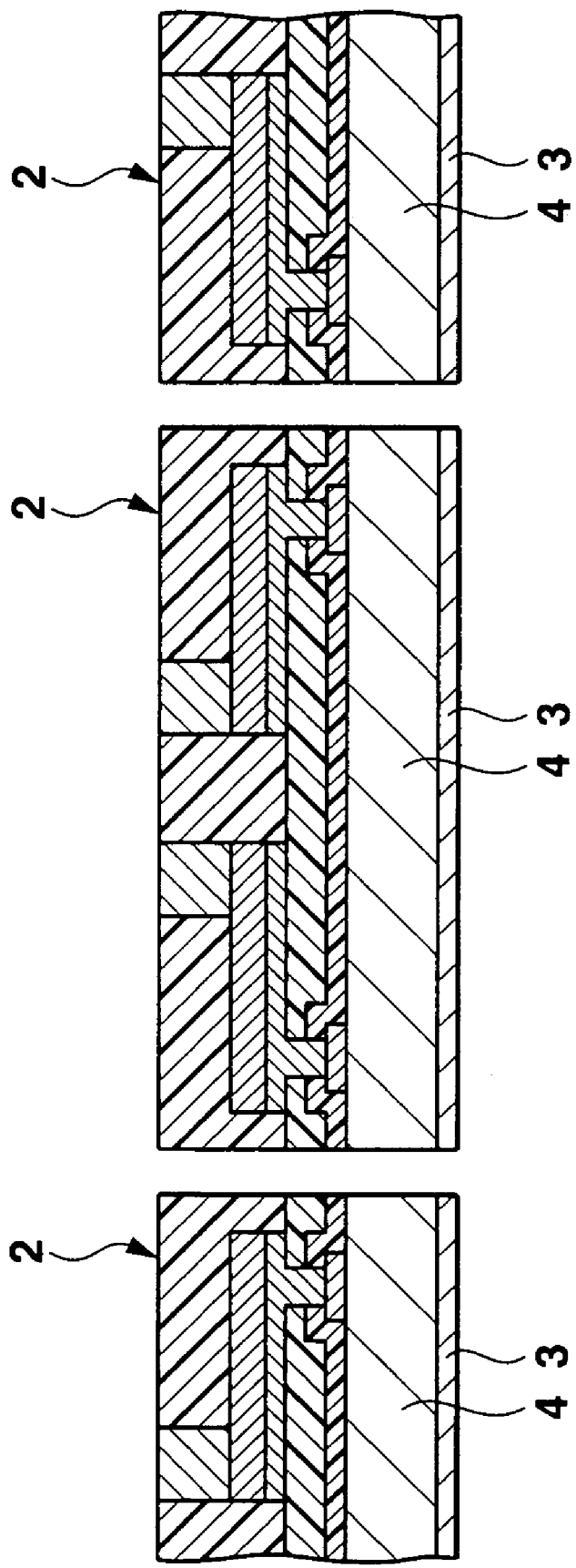
FIG. 9 is a sectional view showing a manufacturing step following FIG. 8.

As shown in FIG. 8, the adhesive layer 3 is bonded to the entire lower surface of the silicon substrate 4. The adhesive layer 3 is made of a die bonding material such as epoxy resin or polyimide resin and sticks to the silicon substrate 4 in a semi-set state by heating and pressing. Next, the adhesive layer 3 sticking to the silicon substrate 4 is bonded to a dicing tape. After a dicing step shown in FIG. 9, the respective structures are peeled from the dicing tape. Accordingly, a plurality of semiconductor constructing bodies 2 each having the adhesive layer 3 on the lower surface of the silicon substrate 4, as shown in FIG. 1, are obtained.

In the semiconductor constructing body 2 thus obtained, the adhesive layer 3 exists on the lower surface of the silicon substrate 4. Hence, the very cumbersome operation for forming an adhesive layer on the lower surface of the silicon substrate 4 of each semiconductor constructing body 2 after the dicing step is unnecessary. The operation for peeling each semiconductor constructing body from the dicing tape after the dicing step is much simpler than the operation for forming an adhesive layer on the lower surface of the silicon substrate 4 of each semiconductor constructing body 2 after the dicing step.

An example will be described next, in which the semiconductor package shown in FIG. 1 is manufactured using the semiconductor constructing body 2 obtained in the above way.

Figure 10:
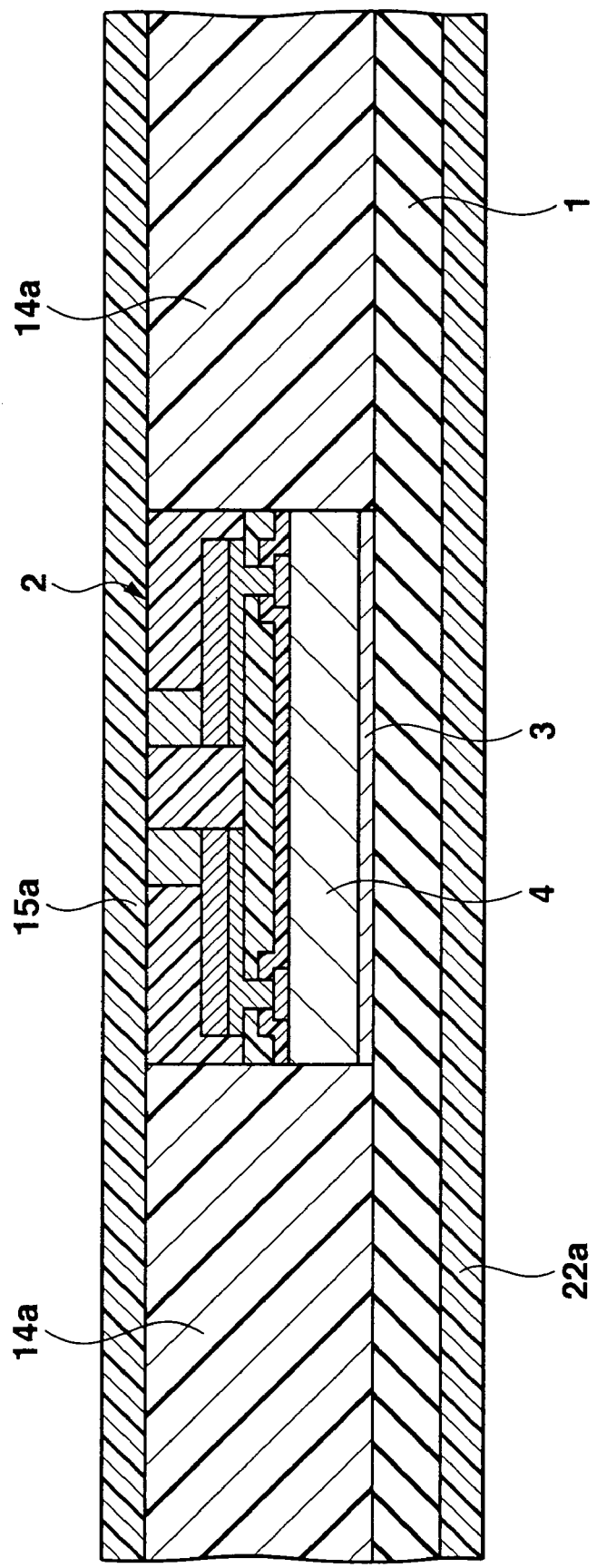
FIG. 10 is a sectional view showing a manufacturing step following FIG. 9.

FIG. 10 is a sectional view showing an example of a method of manufacturing the semiconductor package according to this embodiment.

First, as shown in FIG. 10, the base plate 1 is prepared. The base plate 1 is so large that a plurality of base plates 1 shown in FIG. 1 can be sampled. The base plate 1 has a rectangular planar shape, though its shape is not limited. Next, the adhesive layers 3 bonded to the lower surfaces of the silicon substrates 4 of the semiconductor constructing bodies 2 are bonded to a plurality of predetermined portions on the upper surface (one surface) of the base plate 1. In this bonding process, the adhesive layer 3 is finally set by heating and pressing.

Next, a first insulating material 14a is formed on the upper surface of the base plate 1 between the semiconductor constructing bodies 2 and outside those arranged at the outermost positions by, e.g., screen printing or spin coating. A sheet-shaped second insulating material 15a is placed on the upper surface of the first insulating material 14a.

In addition, a sheet-shaped third insulating material 22a is placed on the lower surface (other surface) of the base plate 1. The first insulating material 14a is made of, e.g., a thermosetting resin or a material prepared by dispersing a reinforcing material such as glass fibers or silica fillers in a thermosetting resin.

The sheet-shaped second and third insulating materials 15a and 22a are not limited to but is preferably made of a build-up material. As the build-up material, a thermosetting resin such as epoxy resin or BT resin, which is mixed with a silica filler and semi-set, can be used. However, as the second and third insulating materials 15a and 22a, a sheet-shaped prepreg material prepared by semi-setting a thermosetting resin or a material containing no filler but only a thermosetting resin may be used.

Figure 11:
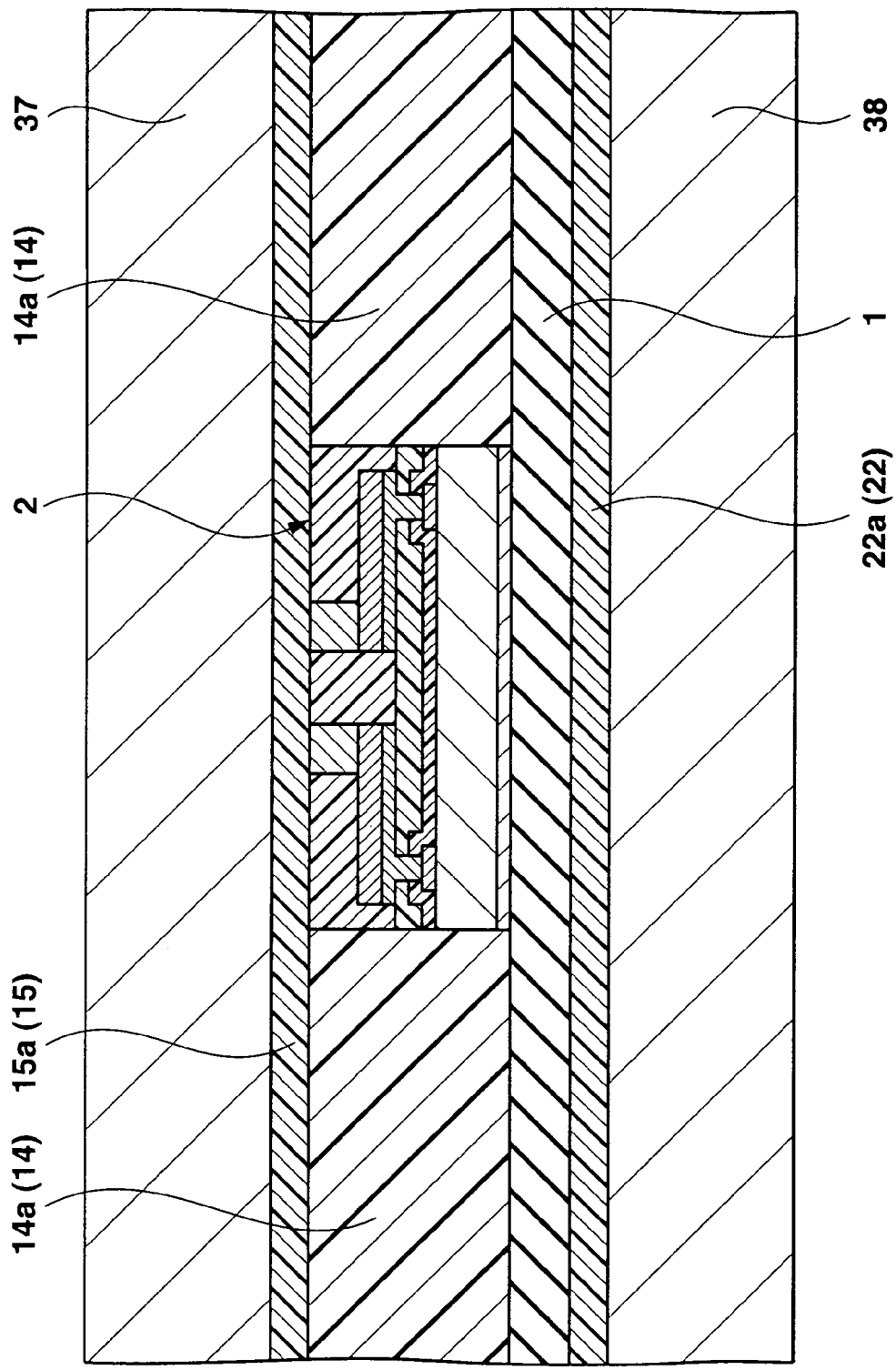
FIG. 11 is a sectional view showing a manufacturing step following FIG. 10.

The first to third insulating materials 14a, 15a, and 22a are heated and pressed by using a pair of heating/pressing plates 37 and 38 shown in FIG. 11. Accordingly, the insulating layer 14 is formed on the upper surface of the base plate 1 between the semiconductor constructing bodies 2 and outside those arranged at the outermost positions. The first upper insulating film 15 is formed on the upper surfaces of the semiconductor constructing bodies 2 and insulating layer 14. The first lower insulating film 22 is formed on the lower surface of the base plate 1.

In this case, the upper surface of the first upper insulating film 15 is pressed by the lower surface of the upper heating/pressing plate 37 and therefore becomes flat. The upper surface of the first lower insulating film 22 is pressed by the upper surface of the lower heating/pressing plate 38 and therefore becomes flat. Hence, no polishing step is necessary for planarizing the upper surface of the first upper insulating film 15 and that of the first lower insulating film 22. For this reason, even when the base plate 1 is relatively large and has a size of, e.g., 500×500 mm, the upper surfaces of the first upper insulating film 15 and first lower insulating film 22 for the plurality of semiconductor constructing bodies 2 arranged on the base plate 1 can easily be planarized at once.

Figure 12:
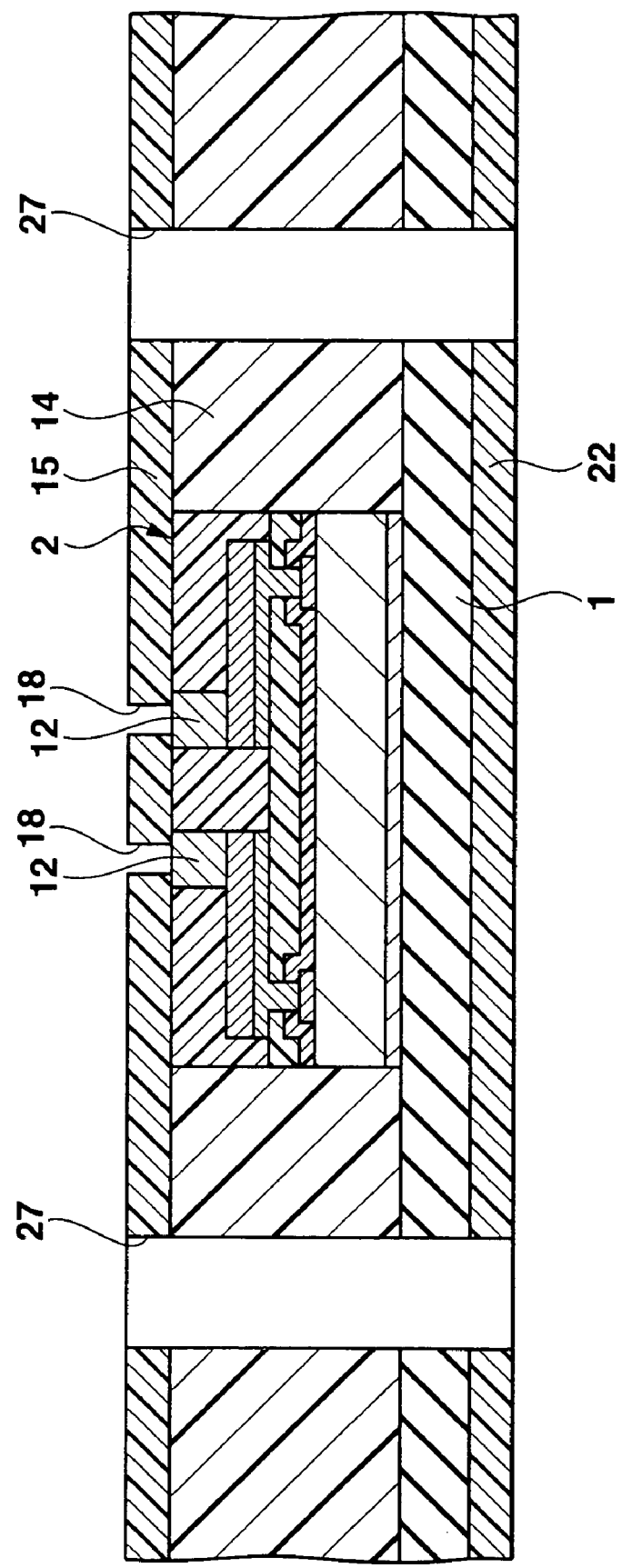
FIG. 12 is a sectional view showing a manufacturing step following FIG. 11.

Next, as shown in FIG. 12, the opening portions 18 are formed in the first upper insulating film 15 at portions corresponding to the central portions of the upper surfaces of the columnar electrodes 12 by, e.g., laser machining for irradiating the structure with a laser beam.

The through holes 27 are formed in the first upper insulating film 15, insulating layer 14, base plate 1, and first lower insulating film 22 at predetermined positions by using a mechanical drill or laser machining for irradiating the structure with a $CO_2$ laser beam. Epoxy smears generated in the opening portions 18 and through holes 27 are removed by a desmearing process, as needed.

Figure 13:
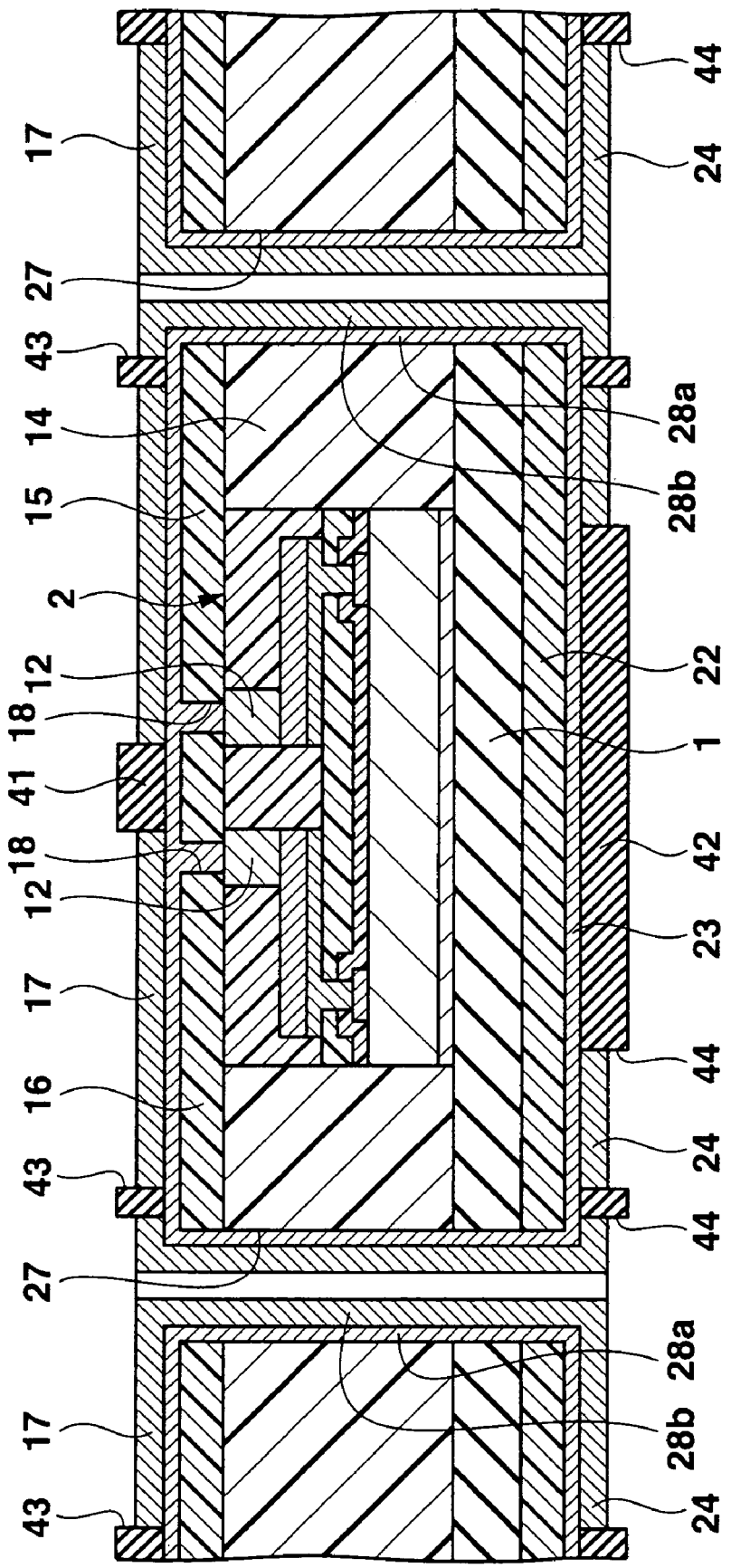
FIG. 13 is a sectional view showing a manufacturing step following FIG. 12.

As shown in FIG. 13, the upper underlying metal layer 16, lower underlying metal layer 23, and underlying metal layer 28a are formed by copper electroless plating on the entire upper surface of the first upper insulating film 15 including the upper surfaces of the columnar electrodes 12 exposed through the opening portions 18, the entire upper surface of the first lower insulating film 22, and on the inner surfaces of the through holes 27.

Next, the upper interconnections 17 and lower interconnections 24 are formed on the upper surface of the upper underlying metal layer 16 and the upper surface of the lower underlying metal layer 23, respectively, by patterning plating. More specifically, an upper plating resist film 41 is formed and then patterned on the upper surface of the upper underlying metal layer 16. A lower plating resist film 42 is also formed and then patterned on the upper surface of the lower underlying metal layer 23. In this case, opening portions 43 are formed in the upper plating resist film 41 at portions corresponding to the formation regions of the upper interconnections 17 including the through holes 27. In addition, opening portions 44 are formed in the lower plating resist film 42 at portions corresponding to the formation regions of the lower interconnections 24 including the through holes 27.

Copper electroplating is executed by using the upper underlying metal layer 16, lower underlying metal layer 23, and underlying metal layer 28a as a plating current path. Accordingly, the upper interconnections 17 are formed on the upper surfaces of the upper underlying metal layer 16 in the opening portions 43 of the upper plating resist film 41. The lower interconnections 24 are formed on the upper surfaces of the lower underlying metal layer 23 in the opening portions 44 of the lower plating resist film 42. Furthermore, the copper layers 28b are formed on the surfaces of the underlying metal layers 28a in the through holes 27.

Figure 14:
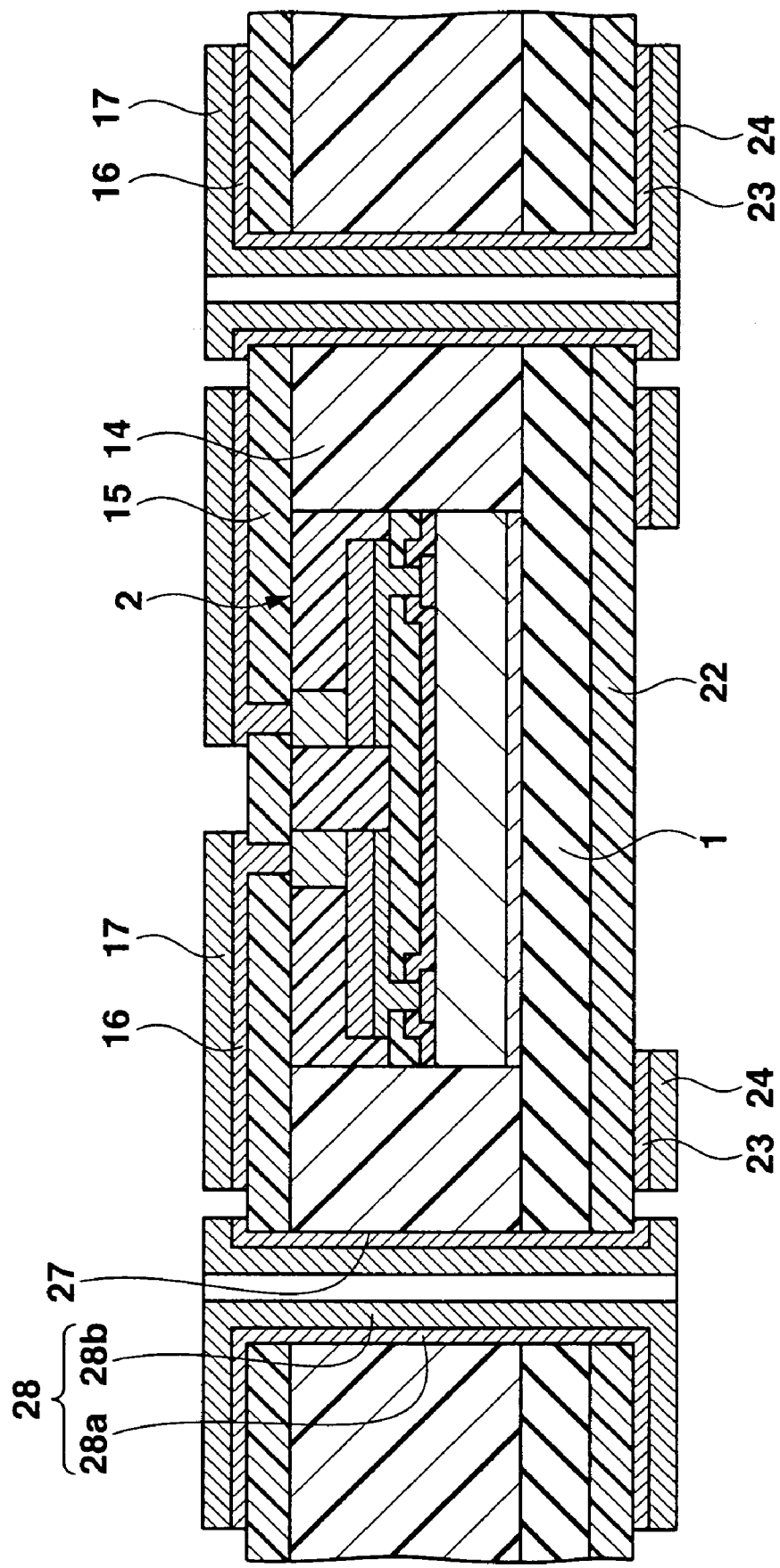
FIG. 14 is a sectional view showing a manufacturing step following FIG. 13.

The plating resist films 41 and 42 are removed. Unnecessary portions of the underlying metal layers 16 and 23 are removed by etching using the upper interconnections 17 and lower interconnections 24 as a mask. As shown in FIG. 14, the upper underlying metal layers 16 are left only under the upper interconnections 17. In addition, the lower underlying metal layers 23 are left only on the lower interconnection 24. In this state, at least some of the upper underlying metal layers 16 including the upper interconnections 17 are connected to the upper surfaces of the columnar electrodes 12 through the opening portions 18 of the first upper insulating film 15. At least some of the upper underlying metal layers 16 including the upper interconnections 17 and the lower underlying metal layers 23 including the lower interconnections 24 are connected through the vertical conducting portions 28 each including the underlying metal layer 28a and copper layer 28b, which are formed on the inner surface of the through hole 27.

Figure 15:
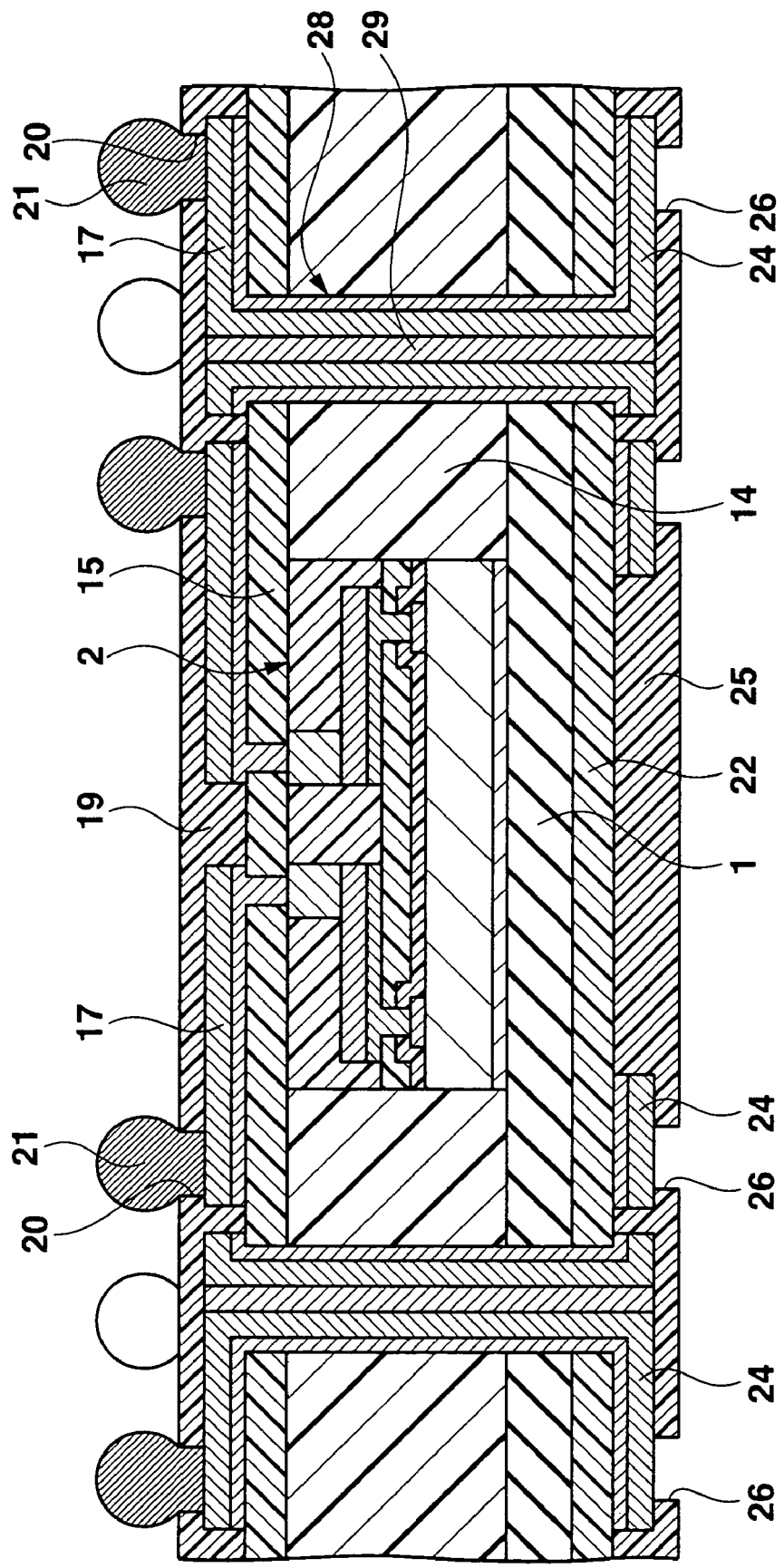
FIG. 15 is a sectional view showing a manufacturing step following FIG. 14.

As shown in FIG. 15, the space in each vertical conducting portion 28 is filled with the conductive material 29 such as copper paste, silver paste, or a conductive resin by screen printing. The extra conductive material 29 projecting from each through hole 27 is removed by buffing, as needed.

The second upper insulating film 19 made of solder resist is formed on the upper surface of the first upper insulating film 15 including the upper interconnections 17 by screen printing or spin coating. In this case, the opening portions 20 are formed in the second upper insulating film 19 at portions corresponding to the connection pad portions of the upper interconnections 17. In addition, the second lower insulating film 25 made of solder resist is formed on the upper surface of the first lower insulating film 22 including the lower interconnections 24 by screen printing or spin coating. In this case, the opening portions 26 are formed in the second lower insulating film 25 at portions corresponding to the connection pad portions of the lower interconnections 24.

The solder balls 21 are formed in and above the opening portions 20 and connected to the connection pad portions of the upper interconnections 17. When the second upper insulating film 19, first upper insulating film 15, insulating layer 14, base plate 1, first lower insulating film 22, and second lower insulating film 25 are cut between the adjacent semiconductor constructing bodies 2, a plurality of semiconductor devices shown in FIG. 1 are obtained.

In the above-described manufacturing method, the plurality of semiconductor constructing bodies 2 are arranged on the base plate 1 via the adhesive layer 3. Particularly, the upper interconnections 17, lower interconnections 24, vertical conducting portions 28, and solder balls 21 are formed at once for the plurality of semiconductor constructing bodies 2. Then, the structure is separated to obtain a plurality of semiconductor devices. Hence, the manufacturing step can be simplified. From the manufacturing step shown in FIG. 12, the plurality of semiconductor constructing bodies 2 can be transported together with the base plate 1. This also simplifies the manufacturing step.

Modifications of the semiconductor package according to the first embodiment will be described next.

(First Modification)

In the above-described embodiment, the solder balls 21 are arrayed in a matrix in correspondence with the entire upper surface of the semiconductor constructing body 2 and the insulating layer 14 around it. However, the present invention is not limited to this. For example, the solder balls 21 may be arranged only on a region corresponding to the insulating layer 14 around the semiconductor constructing body 2. In this case, the solder balls 21 may be formed not totally around the semiconductor constructing body 2 but on only one to three sides of the four sides of the semiconductor constructing body 2.

(Second Modification)

In the above-described embodiment, as shown in FIG. 13, the upper interconnections 17 and lower interconnections 24 are formed by patterning plating by electroplating. However, the present invention is not limited to this. The interconnections may be formed by patterning etching. More specifically, for example, a copper layer is formed by electroplating on the entire surfaces of the upper underlying metal layer 16, lower underlying metal layer 23, and underlying metal layer 28a, which are formed by electroless plating. The copper layer and the upper underlying metal layer 16, lower underlying metal layer 23, and underlying metal layer 28a are continuously patterned by photolithography to form the upper interconnections 17 including the upper underlying metal layers 16 and the lower interconnections 24 including the lower underlying metal layers 23, as shown in FIG. 14. In either method, a thin conductive film made of carbon may be formed in each through hole 27 before electroless plating.

(Third Modification)

As the degree of integration increases, the micropatterning of the upper interconnections 17 is required to be relatively fine. On the other hand, the pattern accuracy required for the lower interconnections 24 is relatively low because thin-film circuit elements such as inductor circuits or antenna circuits are formed by the wiring pattern, or relatively coarse interconnections to mount electronic components are formed.

Generally, the patterning accuracy of an interconnection layer formed by patterning plating depends on the accuracy of the pattern formed by a plating resist film. A plating resist film is relatively thick, and therefore, the side etching amount is large. For this reason, the patterning accuracy is relatively low, and the patterning accuracy of an interconnection layer formed by patterning plating is also low. Hence, patterning plating is not suitable for micropatterning. On the other hand, the patterning accuracy of an interconnection layer formed by patterning etching depends on the patterning accuracy of etching of an interconnection layer formed by electroplating. This interconnection layer is relatively thin, and therefore, the side etching amount is small. For this reason, patterning can be executed at a relatively high accuracy. Hence, patterning etching is suitable for micropatterning.

The upper interconnections 17 which require relatively fine micropatterning may be formed by patterning etching while the lower interconnections 24 which require no fine micropatterning may be formed by patterning plating. In this case, the two surfaces may be processed simultaneously or separately one by one. If the surfaces are to be separately processed one by one, one surface is covered with a resist or a protective film during processing of the other surface. In either processing method, a vertical conducting portion forming method to be described next may be employed.

(Fourth Modification)

In the above-described embodiment, the vertical conducting portion 28 including the underlying metal layer 28a and copper layer 28b is formed in each through hole 27. However, the present invention is not limited to this.

For example, instead of forming the underlying metal layer 28a and copper layer 28b in the through hole 27, the through hole 27 may fully be filled with a conductive material such as copper paste, silver paste, or a conductive resin to form the vertical conducting portion.

In this case, before formation of the through holes 27, the upper underlying metal layers 16, upper interconnections 17, lower underlying metal layers 23, and lower interconnections 24 are formed first, as shown in FIG. 13, by electroless plating and electroplating.

Next, protective films are bonded to the two surfaces overall. The through holes 27 are formed in the structure including the protective films, the upper underlying metal layers 16, upper interconnections 17, lower underlying metal layers 23, and lower interconnections 24 by using a mechanical drill or laser machining for irradiating the structure with a $CO_2$ laser beam. The space in each through hole 27 is filled with a conductive material such as copper paste, silver paste, or a conductive resin by screen printing. The extra conductive material projecting from each through hole 27 is removed by buffing. When the conductive material is baked and hardened, a vertical conducting portion is formed.

Second Embodiment

Figure 16:
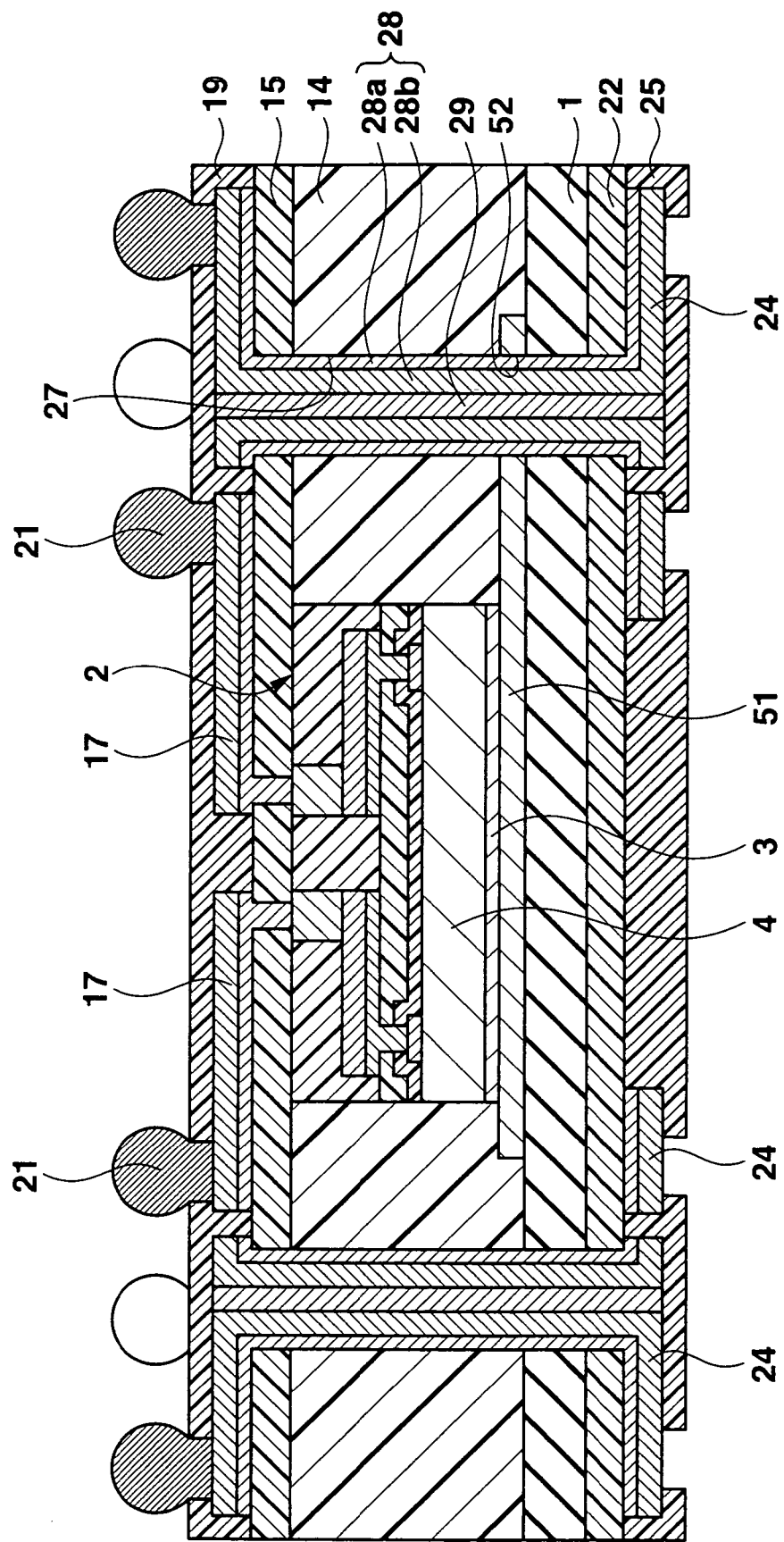
FIG. 16 is a sectional view showing a semiconductor package according to the second embodiment of the present invention.

FIG. 16 is a sectional view showing a semiconductor package according to the second embodiment of the present invention.

This semiconductor device is different from the first embodiment shown in FIG. 1 in the following points. A ground layer 51 made of, e.g., a copper foil is formed at a predetermined portion of the upper surface of a base plate 1. The lower surface of a silicon substrate 4 of a semiconductor constructing body 2 is bonded to the upper surface of the ground layer 51 via an adhesive layer 3. The inner surface of a circular hole 52 formed at a predetermined portion of the ground layer 51 is connected to an underlying metal layer 28a of a vertical conducting portion 28. In this case, the circular hole 52 is formed in the ground layer 51 simultaneously with formation of through holes 27. When the underlying metal layer 28a is formed in the through hole 27, the underlying metal layer 28a is connected to the inner surface of the circular hole 52 in the ground layer 51.

Third Embodiment

Figure 17:
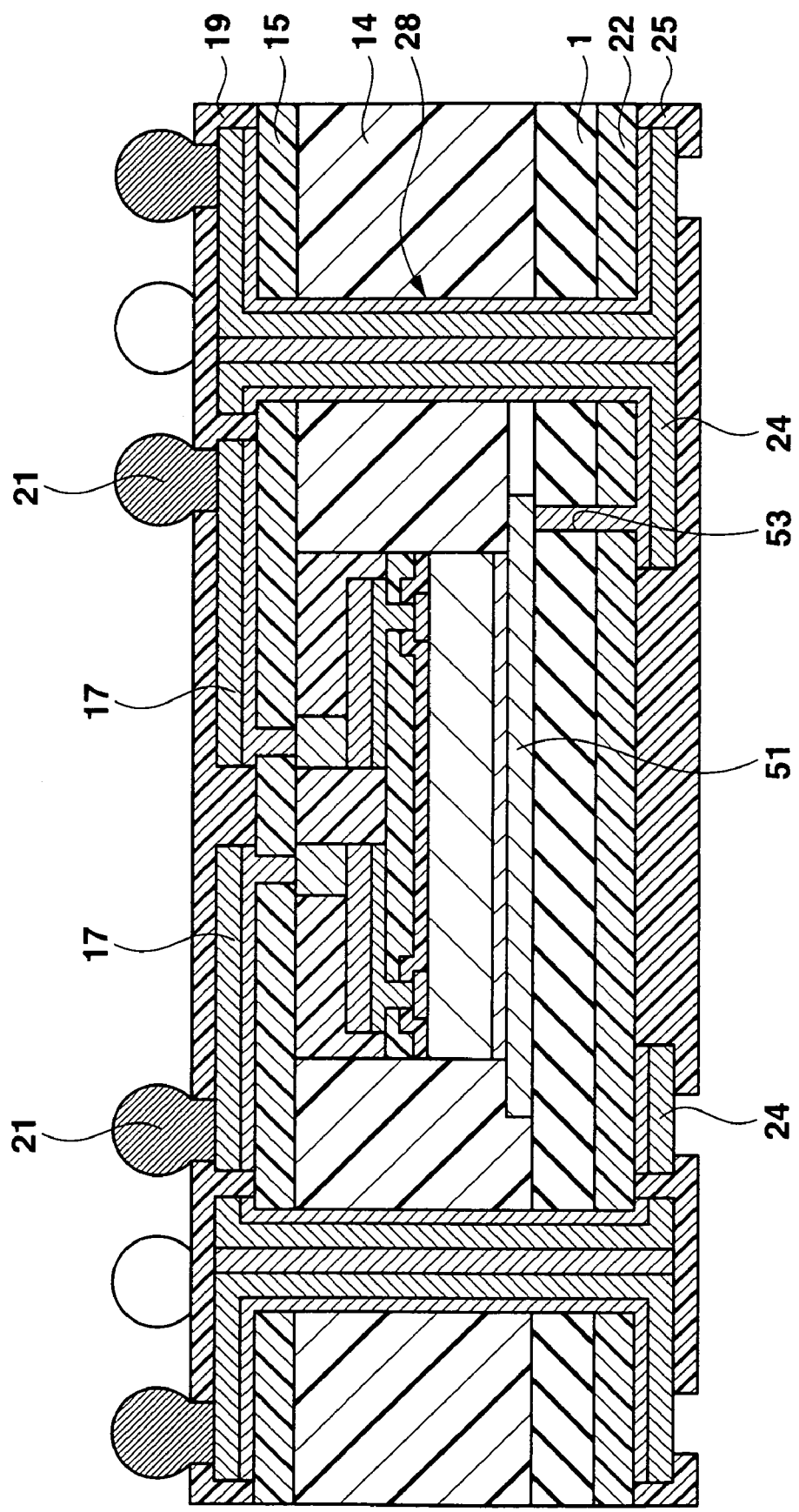
FIG. 17 is a sectional view showing a semiconductor package according to the third embodiment of the present invention.

FIG. 17 is a sectional view showing a semiconductor package according to the third embodiment of the present invention.

In the second embodiment shown in FIG. 16, the vertical conducting portion 28 is connected to the ground layer 51. However, the present invention is not limited to this. For example, as in the third embodiment of the present invention shown in FIG. 17, a lower interconnection 24 including a lower underlying metal layer 23 may be connected to a ground layer 51 through an opening portion 53 formed in a first lower insulating film 22 and base plate 1.

Fourth Embodiment

Figure 18:
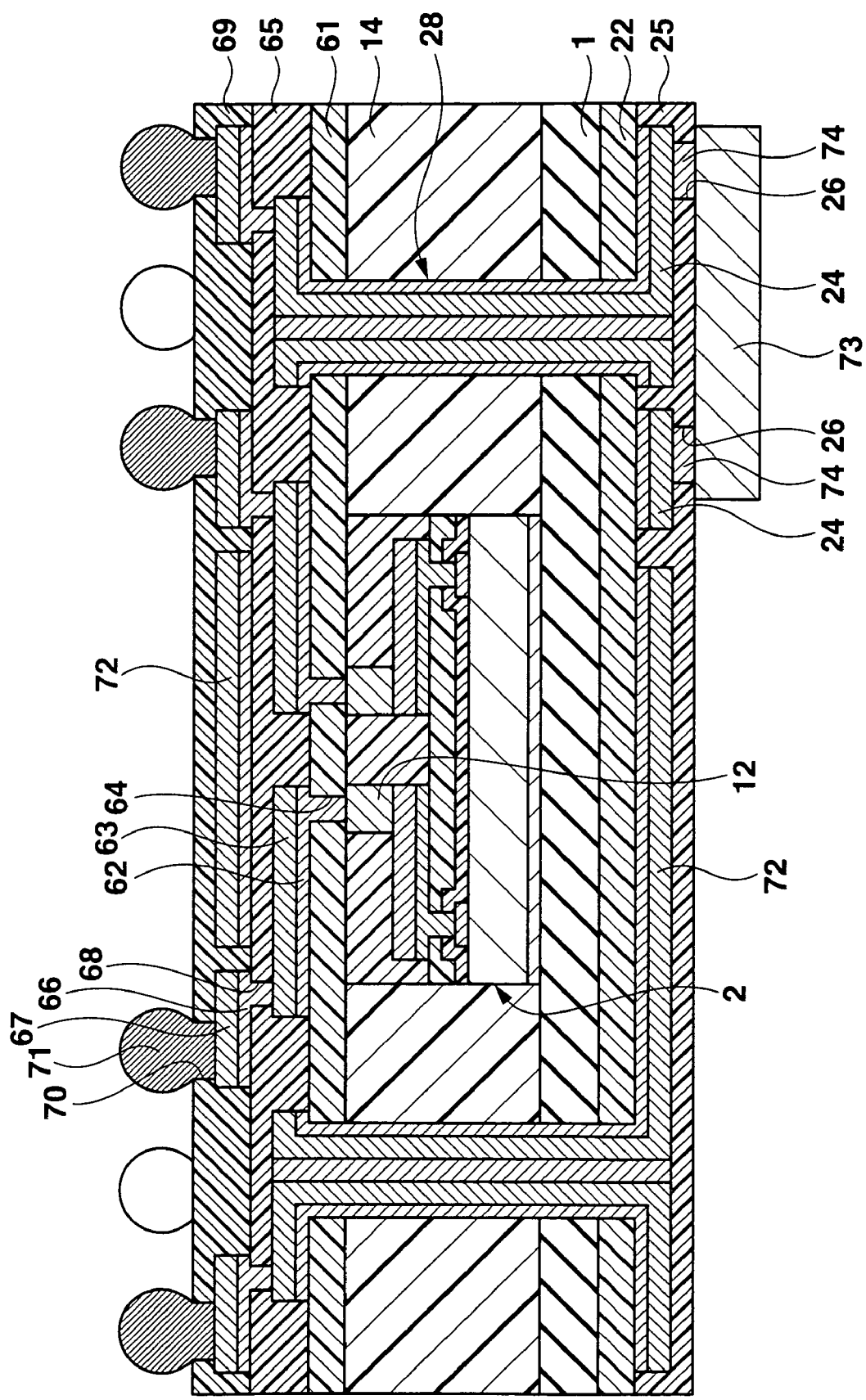
FIG. 18 is a sectional view showing a semiconductor package according to the fourth embodiment of the present invention.

FIG. 18 is a sectional view showing a semiconductor package according to the fourth embodiment of the present invention.

In the first embodiment, the upper underlying metal layer 16 including only one layer is formed on the first upper insulating film 15, as shown in FIG. 1. However, the present invention is not limited to this. For example, as in the fourth embodiment of the present invention shown in FIG. 16, two layers or three or more layers may be formed.

More specifically, a first upper insulating film 61 made of a build-up material is formed on the upper surfaces of a semiconductor constructing body 2 and insulating layer 14. First upper interconnections 63 including first upper underlying metal layers 62 are formed on the upper surface of the first upper insulating film 61 and connected to the upper surfaces of columnar electrodes 12 through opening portions 64 formed in the first upper insulating film 61.

A second upper insulating film 65 made of a build-up material is formed on the upper surface of the first upper insulating film 61 including the first upper interconnections 63. Second upper interconnections 67 including second underlying metal layers 66 are formed on the upper surface of the second upper insulating film 65 and connected to the connection pad portions of the first upper interconnections 63 through opening portions 68 formed in the second upper insulating film 65.

A third upper insulating film 69 made of solder resist is formed on the upper surface of the second upper insulating film 65 including the second upper interconnections 67. Opening portions 70 are formed in the third upper insulating film 69 at portions corresponding to the connection pad portions of the second upper interconnections 67. A solder ball 71 is formed in and above each opening portion 70 and connected to the connection pad portion of a corresponding one of the second upper interconnections 67.

In the fourth embodiment, the first upper interconnections 63 including the first upper underlying metal layers 62 and lower interconnections 24 including lower underlying metal layers 23 are connected through vertical conducting portions 28. However, the present invention is not limited to this. The second upper interconnections 67 including the second underlying metal layers 66 and the lower interconnections 24 including the lower underlying metal layers 23 may be connected through the vertical conducting portions 28.

In the fourth embodiment, the solder balls 71 are formed only on a region corresponding to the insulating layer 14 having a rectangular frame shape around the semiconductor constructing body 2. As a result, most part of the upper surface of the second upper insulating film 65 in a region corresponding to the semiconductor constructing body 2 is an extra region which can be prevented from having the second upper interconnections 67 connected to the solder balls 71. The size of an electronic device may be reduced by forming, in this extra region, a thin-film passive element 72 such as a capacitor circuit element, inductor circuit element, or antenna circuit element formed from the second upper interconnection.

A chip component 73 such as a capacitor or resistor may be mounted at a predetermined portion of the peripheral portion of the upper surface of a second lower insulating film 25 to further reduce the device size and wiring length. In this case, the two electrodes of the chip component 73 are connected to the lower interconnections 24 through solder portions 74 which fill opening portions 26 by screen printing.

The thin-film passive element 72 such as a capacitor circuit element, inductor circuit element, or antenna circuit element formed from the lower interconnection may be formed on the upper surface of the first lower insulating film 22 in a region except the mounting region of the chip component 73. In this case, a relatively large area can be ensured as the formation region of the thin-film passive element 72. Hence, the passive element having a relatively large area can satisfactorily be formed.

In this case, the chip component 73 is formed at the peripheral portion of the upper surface of the second lower insulating film 25 so that the second lower insulating film 25 has a flat region almost at the central portion of the upper surface. The flat region at the central portion can be used as a suction head suction region (mounting pickup region) which is sucked by a suction head to handle the semiconductor device.

A plurality of chip components 73 may be mounted almost on the entire region of the upper surface including a portion near the central portion of the upper surface of the second lower insulating film 25. In this case, the device size and wiring length can further be reduced. However, it becomes difficult to ensure a flat suction head suction region. The fifth and sixth embodiments will be described below, in which a flat suction head suction region can be ensured even in the above case.

Fifth Embodiment

Figure 19:
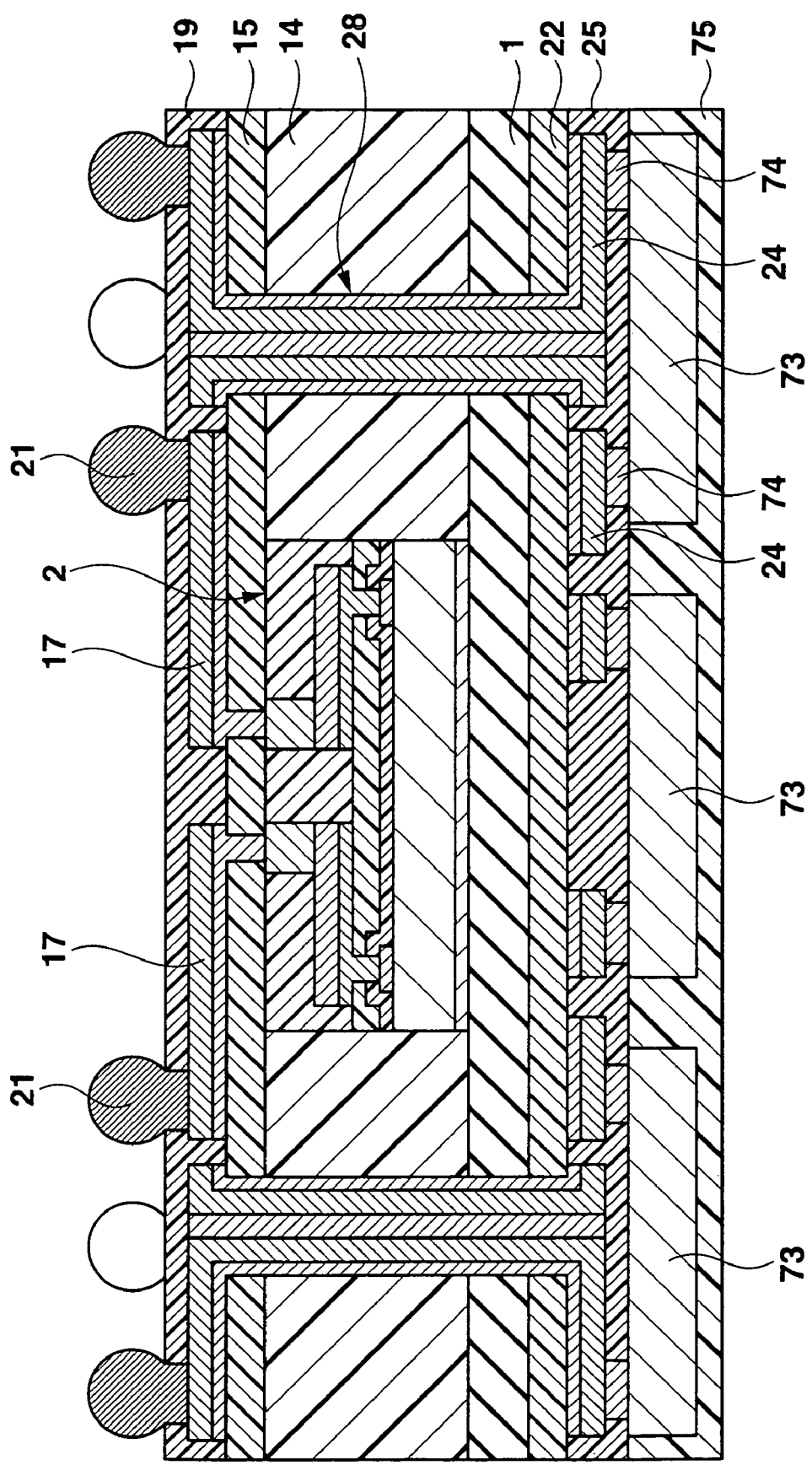
FIG. 19 is a sectional view showing a semiconductor package according to the fifth embodiment of the present invention.

FIG. 19 is a sectional view showing a semiconductor package according to the fifth embodiment of the present invention.

In this semiconductor package, a plurality of chip components 73 are mounted on the entire region including almost the central portion of the upper surface of a second lower insulating film 25. These chip components 73 are covered with a sealing film 75 made of epoxy resin or polyimide resin. The upper surface of the sealing film 75 is planarized by polishing. The flat upper surface is used as a suction head suction region.

Sixth Embodiment

Figure 20:
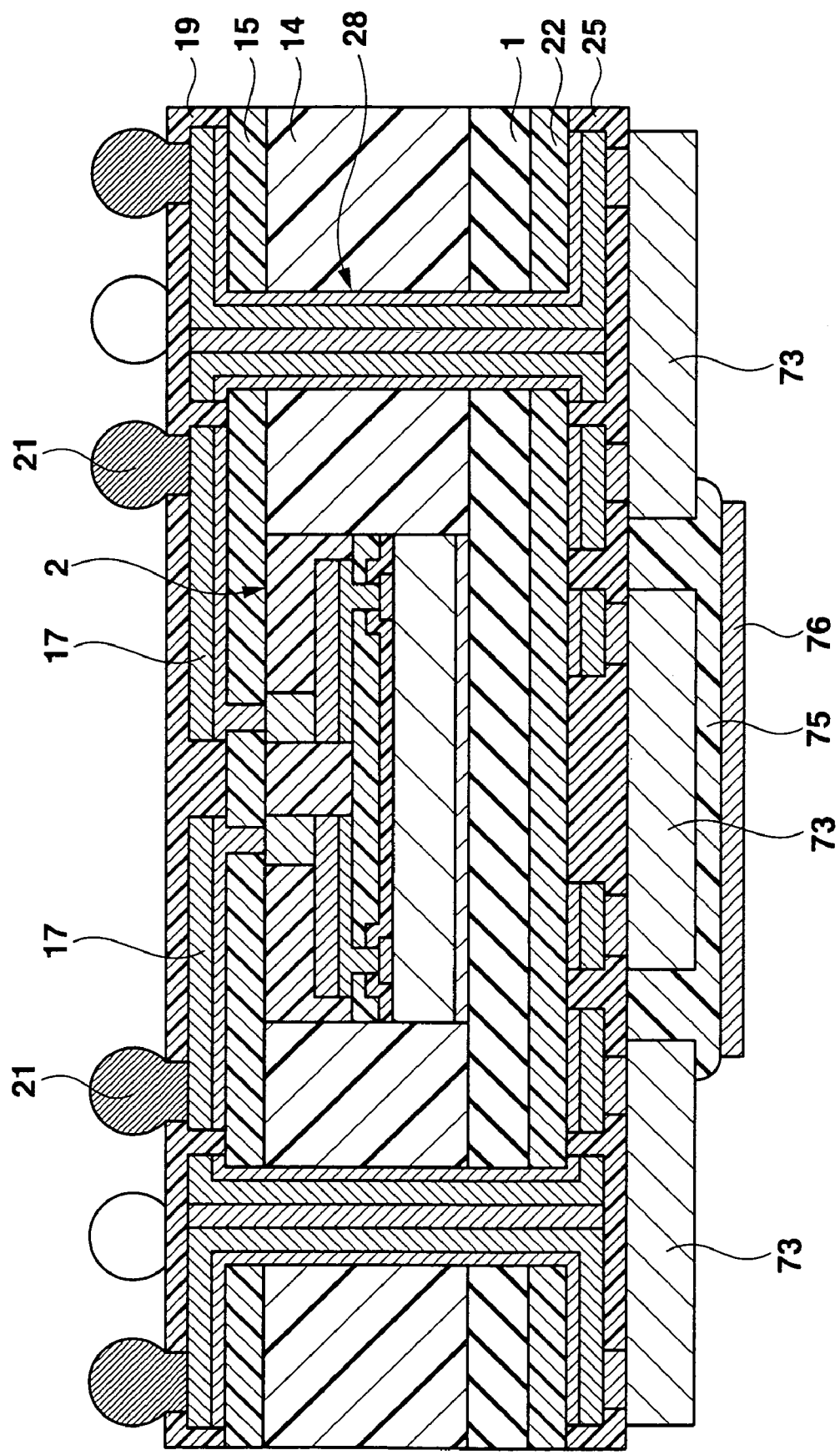
FIG. 20 is a sectional view showing a semiconductor package according to the sixth embodiment of the present invention.

FIG. 20 is a sectional view showing a semiconductor package according to the sixth embodiment of the present invention.

In this semiconductor package, a plurality of chip components 73 are mounted on the entire region including almost the central portion of the upper surface of a second lower insulating film 25. The chip component 73 mounted almost at the central portion of the upper surface of the second lower insulating film 25 is covered with a sealing film 75 made of epoxy resin or polyimide resin. A flat plate 76 formed from a metal plate is bonded to the upper surface of the sealing film 75. The upper surface of the flat plate 76 is used as a suction head suction region.

In place of or together with the chip components 73, a semiconductor IC chip made of an integrated circuit such as an LSI or a structure similar to the semiconductor constructing body 2 shown in FIG. 1 may be mounted.

Seventh Embodiment

Figure 21:
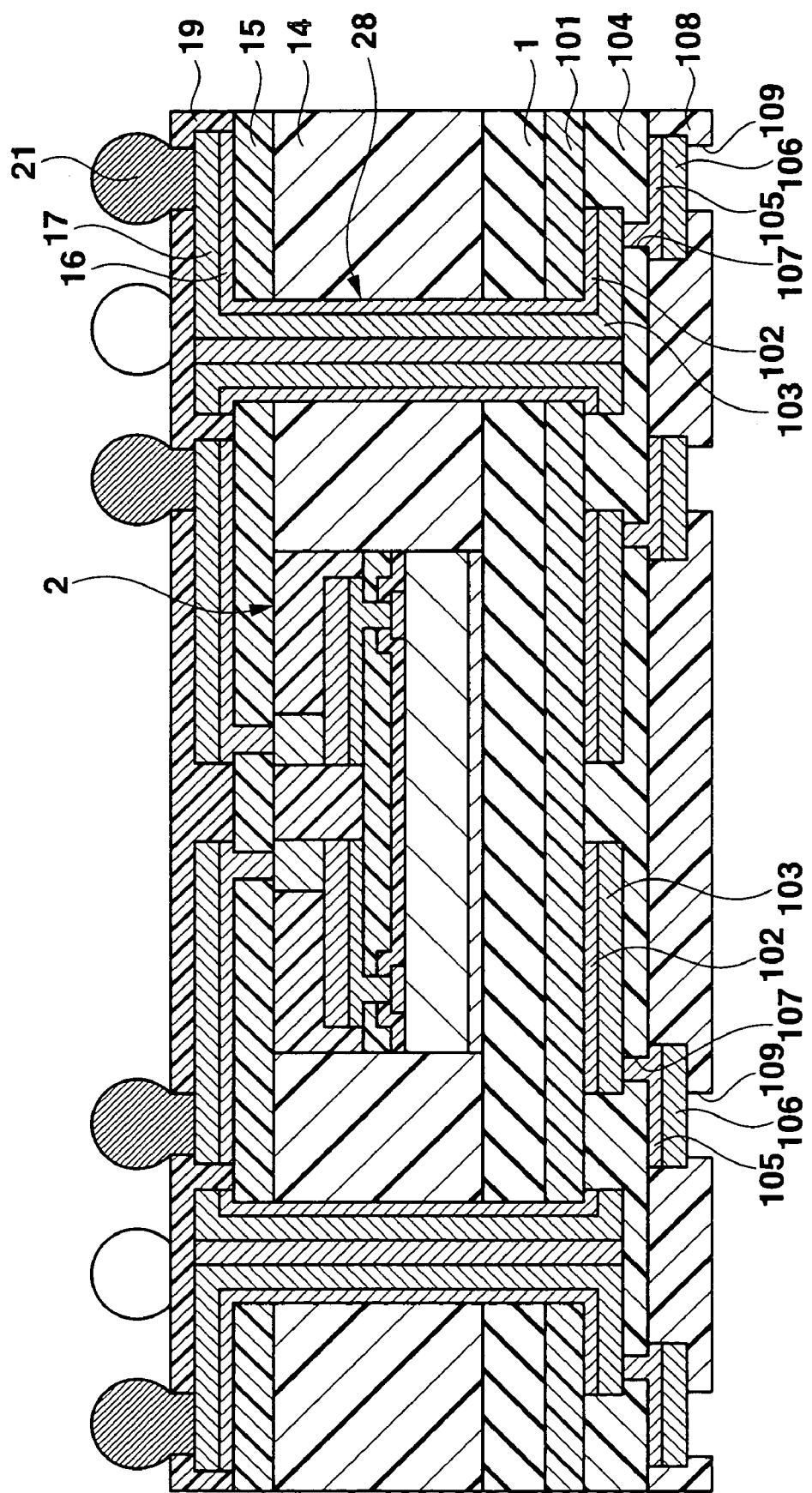
FIG. 21 is a sectional view showing a semiconductor package according to the seventh embodiment of the present invention.

FIG. 21 is a sectional view showing a semiconductor package according to the seventh embodiment of the present invention.

In the first embodiment, the lower interconnections 24 each including only one layer are formed under the first lower insulating film 22, as shown in FIG. 1. However, the present invention is not limited to this. For example, as in the seventh embodiment of the present invention shown in FIG. 21, two layers or three or more layers may be formed.

More specifically, a first lower insulating film 101 made of a build-up material is formed on the lower surface of a base plate 1. First lower interconnections 103 including lower underlying metal layers 102 are formed on the lower surface of the first lower insulating film 101 and connected to vertical conducting portions 28.

A second lower insulating film 104 made of a build-up material is formed on the lower surface of the first lower insulating film 101 including the first lower interconnections 103. Second lower interconnections 106 including second lower underlying metal layers 105 are formed on the lower surface of the second lower insulating film 104 and connected to the connection pad portions of the first lower interconnections 103 through opening portions 107 formed in the second lower insulating film 104. A third lower insulating film 108 made of solder resist is formed on the lower surface of the second lower insulating film 104 including the second lower interconnections 106. Opening portions 109 are formed in the third lower insulating film 108 at portions corresponding to the connection pad portions of the second lower interconnections 106.

In the seventh embodiment, upper interconnections 17 including upper underlying metal layers 16 and the first lower interconnections 103 including the lower underlying metal layers 102 are connected through the vertical conducting portions 28. However, the present invention is not limited to this. The upper interconnections 17 including the upper underlying metal layers 16 and the second lower interconnections 106 including the second lower underlying metal layers 105 may be connected through the vertical conducting portions.

When each upper interconnection includes two or more layers, and each lower interconnection includes two or more layers, one of the layers of the upper interconnection and one of the layers of the lower interconnection may be connected through a vertical conducting portion, including the cases shown in FIGS. 18 and 21.

Eighth Embodiment

Figure 22:
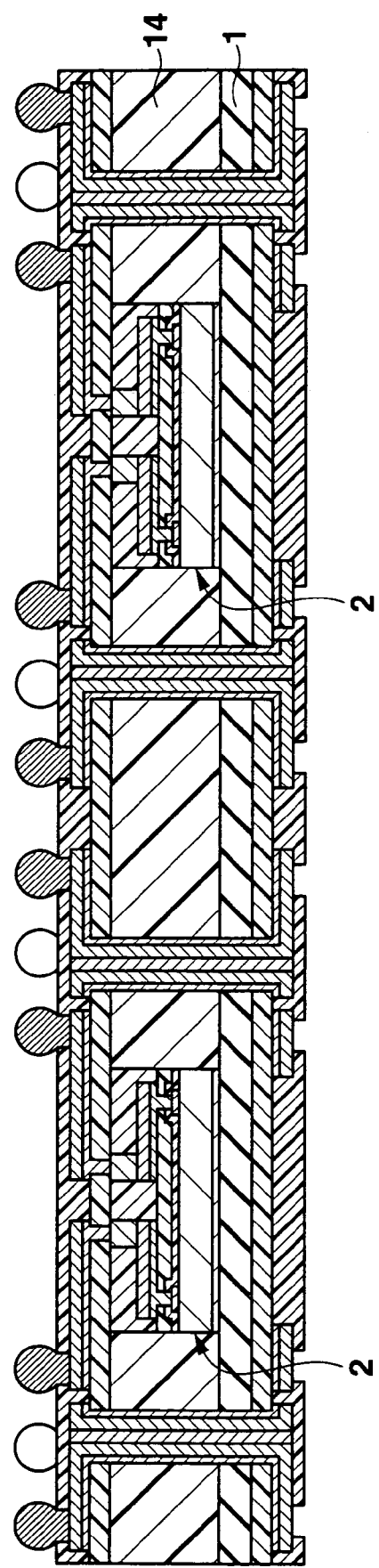
FIG. 22 is a sectional view showing a semiconductor package according to the eighth embodiment of the present invention.

FIG. 22 is a sectional view showing a semiconductor package according to the eighth embodiment of the present invention.

In the first embodiment, the resultant structure is cut between the semiconductor constructing bodies 2 adjacent to each other. However, the present invention is not limited to this. For example, as in the eighth embodiment of the present invention shown in FIG. 22, the resultant structure may be cut for every two semiconductor constructing bodies 2 to obtain a multi-chip module type semiconductor device. Alternatively, the resultant structure may be cut for every two or more semiconductor constructing bodies 2. In this case, the semiconductor constructing bodies 2 of one set can be either of the same type or of different types.

Ninth Embodiment

Figure 23:
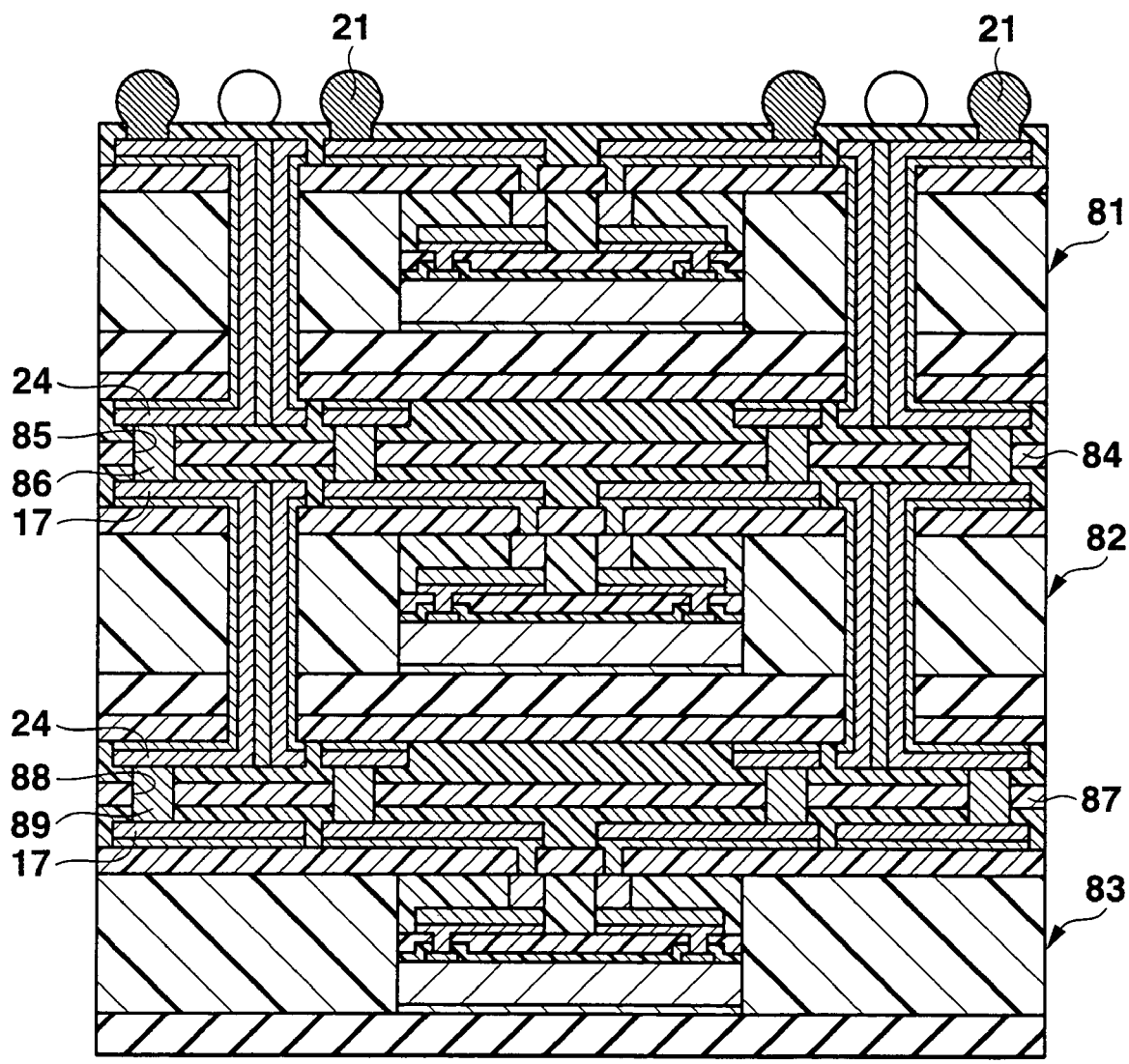
FIG. 23 is a sectional view showing a semiconductor package according to the ninth embodiment of the present invention.

FIG. 23 is a sectional view showing a semiconductor package according to the ninth embodiment of the present invention.

In this semiconductor package, second and third semiconductor packages 82 and 83 are mounted under a first semiconductor package 81 having, e.g., the same structure as shown in FIG. 1.

In this case, the second semiconductor block 82 has no solder balls 21, unlike, e.g., the structure shown in FIG. 1.

The third semiconductor block 83 has no through holes 27, vertical conducting portions 28, conductive materials 29, first lower insulating film 22, second lower insulating film 25, lower underlying metal layers 23, lower interconnections 24, and solder balls 21, unlike, e.g., the structure shown in FIG. 1.

The first semiconductor block 81 and the second semiconductor block 82 are bonded via an adhesive layer 84 inserted between them. The connection pad portions of the lower interconnections 24 of the first semiconductor block 81 are connected to the connection pad portions of upper interconnections 17 of the second semiconductor block 82 through conductive materials 86 formed in through holes 85 formed in the adhesive layer 84.

The second semiconductor block 82 and the third semiconductor block 83 are bonded via an adhesive layer 87 inserted between them. The connection pad portions of the lower interconnections 24 of the second semiconductor block 82 are connected to the connection pad portions of the upper interconnections 17 of the third semiconductor block 83 through conductive materials 89 formed in through holes 88 formed in the adhesive layer 87.

(Manufacturing Method)

An example of a method of manufacturing this semiconductor device will be described next.

Figure 24:
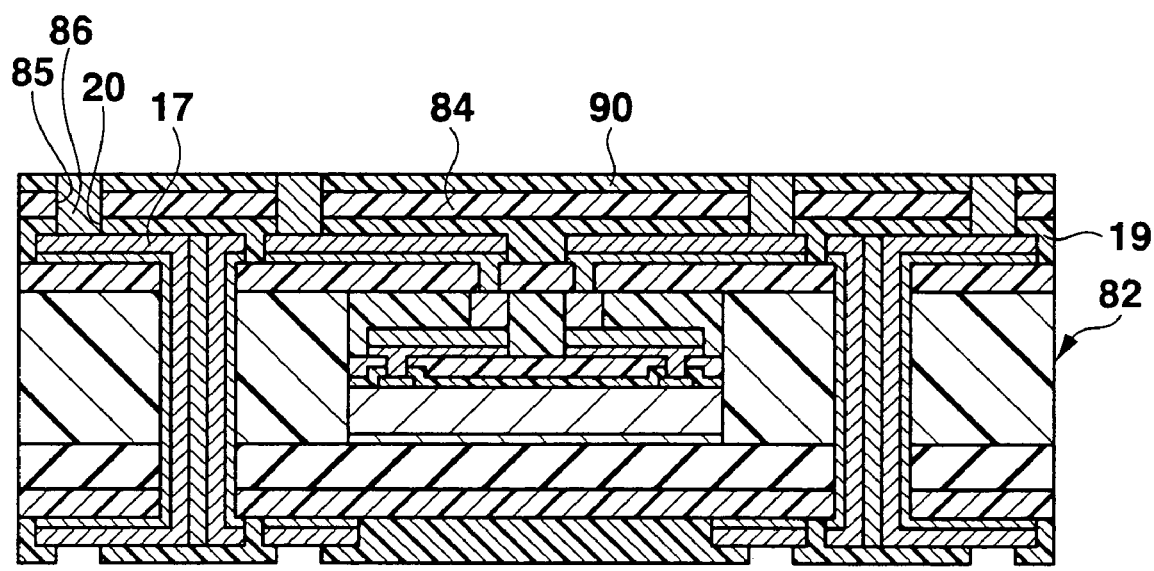
FIG. 24 is a sectional view showing an example of a manufacturing method applied to the semiconductor package according to the ninth embodiment.
Figure 25:
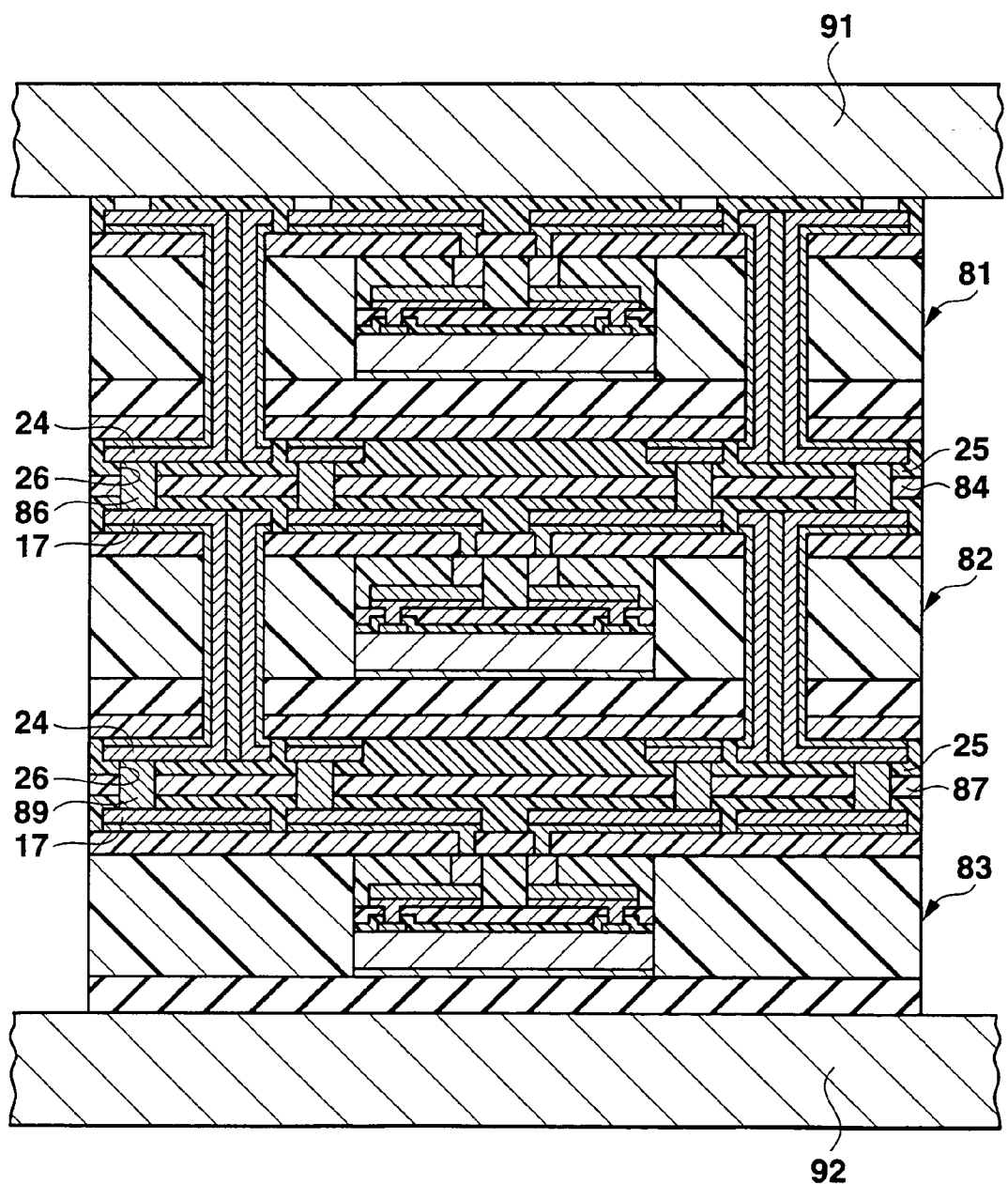
FIG. 25 is a sectional view showing a manufacturing step following FIG. 24.

FIGS. 24 and 25 are sectional views showing an example of a manufacturing method applied to the semiconductor package according to the ninth embodiment.

First, as shown in FIG. 24, for example, the adhesive layer 84 which has a thin sheet shape and is made of a thermosetting resin such as liquid crystal polymer, thermoplastic polyimide, PEEK (polyetheretherketone), or PPS (polyphenylene-sulfide) is bonded to the upper surface of a second upper insulating film 19 of the second semiconductor block 82. In this case, a protective film 90 is bonded to the upper surface of the adhesive layer 84.

Next, the through holes 85 are formed in the protective film 90 and adhesive layer 84 at portions corresponding to opening portions 20 of a second upper insulating film 19, i.e., the connection pad portions of the upper interconnections 17 by, e.g., laser machining for irradiating the structure with a laser beam.

The through holes 85 and opening portions 20 are filled with the conductive material 86 such as copper paste, silver paste, or a conductive resin, which can be sintered at a low temperature, by screen printing.

The protective film 90 is removed. In this state, each conductive material 86 projects from the adhesive layer 84 while having a height equal to the thickness of the protective film 90.

In the same way as described above, the third semiconductor block 83 is prepared by filling, with the conductive materials 89, the through holes 88 and the like formed in the adhesive layer 87 bonded to the upper surface of the second upper insulating film 19. As shown in FIG. 25, the second semiconductor block 82 is placed on the adhesive layer 87 on the third semiconductor block 83. The first semiconductor block 81 is placed on the adhesive layer 84 on the second semiconductor block 82. In this case, no solder balls 21 are formed on the first semiconductor block 81. In this arranged state, the upper portions of the conductive materials 86 and 89 are inserted in opening portions 26 of the second lower insulating films 25 of the semiconductor blocks 81 and 82.

The first to third semiconductor blocks 81 to 83 and the adhesive layers 84 and 87 are heated and pressed by using a pair of heating/pressing plates 91 and 92. Accordingly, the conductive materials 86 and 89 are sintered. The connection pad portions of the lower interconnections 24 of the first semiconductor block 81 are connected to the connection pad portions of the upper interconnections 17 of the second semiconductor block 82 through the conductive materials 86. In addition, the connection pad portions of the lower interconnections 24 of the second semiconductor block 82 are connected to the connection pad portions of the upper interconnections 17 of the third semiconductor block 83 through the conductive materials 89.

When the adhesive layers 84 and 87 are set, the first semiconductor block 81 and second semiconductor block 82 are bonded via the adhesive layer 84 while the second semiconductor block 82 and third semiconductor block 83 are bonded via the adhesive layer 87.

Next, as shown in FIG. 23, the solder balls 21 are formed on the first semiconductor block 81. In this way, the semiconductor device shown in FIG. 22 is obtained.

In the above-described manufacturing method, since the first to third semiconductor blocks 81 to 83 are bonded at once via the adhesive layers 84 and 87 inserted between the blocks, the manufacturing step can be simplified. As in the second semiconductor block 82, the solder balls 21 on the third semiconductor block 83 may be omitted, unlike, e.g., the structure shown in FIG. 1.

Other Embodiments

In the above embodiments, the semiconductor constructing body 2 has, as external connection electrodes, the columnar electrodes 12 formed on the connection pad portions of the interconnections 11. However, the present invention is not limited to this. For example, the semiconductor constructing body 2 may have no columnar electrodes 12 but the interconnections 11 having connection pad portions serving as external connection electrodes. The semiconductor constructing body 2 may have the connection pads 5 serving as external connection electrodes. Alternatively, columnar electrodes may be formed on the connection pads 5 as external connection electrodes. The columnar electrodes may be used as external connection electrode.

For example, in the first embodiment shown in FIG. 1, the solder balls 21 are connected to the connection pad portions of the upper interconnections 17 exposed from the opening portions 20 formed in the second upper insulating film 19. However, the present invention is not limited to this. For example, the solder balls 21 may be connected to the lower interconnections 24 exposed from the opening portions 26 formed in the second lower insulating film 25.

For example, in the fourth embodiment shown in FIG. 18, the chip component 73 or semiconductor chip is mounted on the lower surface of the second lower insulating film 25 and connected to the lower interconnections 24. However, the present invention is not limited to this. For example, the chip component 73 or semiconductor chip may be mounted on the upper surface of the second upper insulating film 19 and connected to the connection pad portions of the upper interconnections 17.

What is claimed is:

1. A semiconductor package comprising:
a base plate having a first surface and a second surface;
at least one semiconductor constructing body including: (i) a semiconductor substrate which is formed on said first surface of the base plate and which has a plurality of connection pads formed on one surface thereof, (ii) a plurality of columnar external connection electrodes which are electrically connected to the connection pads, (iii) a plurality of interconnections, which are formed over said one surface of the semiconductor substrate, each of the interconnections having a first end connected to one of the connection pads and a second end connected to one of the columnar external connection electrodes, such that each of the interconnections is positioned between and electrically connects one of the connection pads and one of the columnar external connection electrodes, and (iv) a sealing film which is provided around the columnar electrodes and which covers the interconnections and said one surface of the semiconductor substrate, wherein an upper surface of the sealing film is flush with upper surfaces of the columnar electrodes;
an insulating layer which is formed on said first surface of the base plate and covers a peripheral surface of the semiconductor constructing body, wherein an upper surface of the insulating layer is flush with the upper surface of the sealing film;
a first upper insulating film which covers the entire upper surface of the insulating layer and an upper surface of the semiconductor constructing body except for a central portion of the upper surface of each of the columnar external connection electrodes, wherein the first upper insulating film has a flat upper surface, and wherein the first upper insulating film comprises a sheet of a build-up material or a prepreg material including a thermosetting resin which has been placed in a semi-set state on the upper surfaces of the insulating layer and the semiconductor constructing body and which has then been pressed and heated by a heating plate on an upper surface of the sheet so as to set the thermosetting resin and form the flat upper surface of the first upper insulating film;
a plurality of upper interconnections, each of which is formed on the first upper insulating film and over the insulating layer and includes at least one interconnection layer, at least some of the upper interconnections being connected to the external connection electrodes of the semiconductor constructing body; and
a plurality of lower interconnections, each of which is formed on said second surface of the base plate and includes at least one interconnection layer, at least some of the lower interconnections being electrically connected to the upper interconnections.

2. A package according to claim 1, further comprising at least one connection terminal portion formed on at least one of the upper interconnections.

3. A package according to claim 2, further comprising at least one projecting electrode which is formed on the connection terminal portion of at least one of the upper interconnections.

4. A package according to claim 3, wherein the projecting electrode includes a solder ball.

5. A package according to claim 1, wherein the first upper insulating film has a sheet shape.

6. A package according to claim 2, further comprising a second upper insulating film which covers the first upper insulating film and the upper interconnections except the at least one connection terminal portion.

7. A package according to claim 6, wherein at least one electronic component is mounted on the second upper insulating film and connected to the connection terminal portion on the upper interconnection.

8. A package according to claim 1, further comprising a vertical conducting portion which connects one of the interconnection layers of the upper interconnections to one of the interconnection layers of the lower interconnections.

9. A package according to claim 8, wherein a through hole is formed in at least the insulating layer and the base plate, and the vertical conducting portion includes at least a conductive material with which the through hole is filled.

10. A package according to claim 8, wherein a through hole is formed in at least the insulating layer and the base plate, and the vertical conducting portion includes at least an interconnection layer formed in the through hole.

11. A package according to claim 10, wherein the vertical conducting portion further includes a conductive material with which the through hole is filled.

12. A package according to claim 8, further comprising a ground layer which is formed on an upper surface of the base plate, and upon which the semiconductor constructing body is formed.

13. A package according to claim 12, wherein the ground layer is connected to the vertical conducting portion.

14. A package according to claim 1, wherein said at least one semiconductor constructing body comprises a plurality of semiconductor constructing bodies formed on the base plate.

15. A package according to claim 14, wherein said plurality of semiconductor constructing bodies are formed on the base plate while being separated from each other.

16. A package according to claim 14, wherein at least some of the external connection electrodes of said plurality of semiconductor constructing bodies are electrically connected to each other through the upper interconnections.

17. A package according to claim 1, further comprising at least one connection terminal portion formed on at least one of the lower interconnections.

18. A package according to claim 17, wherein at least one projecting electrode is formed on the connection terminal portion of the lower interconnection.

19. A package according to claim 18, wherein the projecting electrode includes a solder ball.

20. A package according to claim 17, further comprising a lower insulating film which covers said second surface of the base plate and portions except the at least one connection terminal portion on the at least one of the lower interconnections.

21. A package according to claim 20, further comprising a further lower insulating film which covers an entire surface of said second surface of the base plate, wherein the lower insulating film and the lower interconnections are formed on the further lower insulating film.

22. A package according to claim 21, wherein the further lower insulating film has a sheet shape.

23. A package according to claim 20, further comprising a flat suction head suction region formed on at least a part of the lower insulating film.

24. A package according to claim 20, wherein at least one electronic component is mounted on the lower insulating film and connected to the connection terminal portion of the lower interconnection.

25. A package according to claim 24, wherein the electronic component is mounted at a peripheral portion on the lower insulating film, and a central portion of a surface of the lower insulating film is used as a suction head suction region.

26. A package according to claim 25, wherein said at least one electronic component comprises a plurality of electronic components which are mounted in a region including a central portion of a surface of the lower insulating film, and the plurality of electronic components are covered with a sealing film having a surface used as a suction head suction region.

27. A package according to claim 24, wherein said at least one electronic component comprises a plurality of electronic components which are mounted in a region including a central portion of a surface of the lower insulating film,
wherein at least an electronic component mounted at the central portion of the surface of the lower insulating film is covered with a sealing film,
wherein a flat plate is placed on a surface of the sealing film, and
wherein a surface of the flat plate is used as a suction head suction region.

28. A package according to claim 1, wherein a thin film circuit element is formed by at least some of the lower interconnections or some of the upper interconnections.

29. A package according to claim 28, wherein the thin film circuit element includes one of a capacitor circuit element, an inductor circuit element, and an antenna circuit element.

30. A package according to claim 1, further comprising a ground layer which is formed on an upper surface of the base plate, and upon which the semiconductor constructing body is formed.

31. A package according to claim 30, wherein the ground layer is connected to the lower interconnections.

32. A semiconductor package comprising:
a first semiconductor package and at least one second semiconductor package;
wherein the first semiconductor package comprises:
a base plate,
at least one semiconductor constructing body including: (i) a semiconductor substrate which is formed on one surface of the base plate and which has a plurality of connection pads formed on one surface thereof, (ii) a plurality of columnar external connection electrodes which are electrically connected to the connection pads, (iii) a plurality of interconnections, which are formed over said one surface of the semiconductor substrate, each of the interconnections having a first end connected to one of the connection pads and a second end connected to one of the columnar external connection electrodes, such that each of the interconnections is positioned between and electrically connects one of the connection pads and one of the columnar external connection electrodes, and (iv) a sealing film which is provided around the columnar electrodes and which covers the interconnections and said one surface of the semiconductor substrate, wherein an upper surface of the sealing film is flush with upper surfaces of the columnar electrodes,
an insulating layer which is formed on said one surface of the base plate and covers a peripheral surface of the semiconductor constructing body, wherein an upper surface of the insulating layer is flush with the upper surface of the sealing film,
a first upper insulating film which covers the entire upper surface of the insulating layer and an upper surface of the semiconductor constructing body except for a central portion of the upper surface of each of the columnar external connection electrodes, wherein the first upper insulating film has a flat upper surface, and wherein the first upper insulating film comprises a sheet of a buildup material or a prepreg material including a thermosetting resin which has been placed in a semi-set state on the upper surfaces of the insulating layer and the semiconductor constructing body and which has then been pressed and heated by a heating plate on an upper surface of the sheet so as to set the thermosetting resin and form the flat upper surface of the first upper insulating film, and
upper interconnections, each of which is formed on the first upper insulating film over the insulating layer and includes at least one interconnection layer, at least some of the upper interconnections being connected to the external connection electrodes of the semiconductor constructing body and having at least one connection terminal portion,
wherein each said second semiconductor package comprises:
a base plate, at least one semiconductor constructing body including:
(i) a semiconductor substrate which is formed on a first surface of the base plate and has a plurality of connection pads formed on one surface thereof, (ii) a plurality of columnar external connection electrodes which are electrically connected to the connection pads, (iii) a plurality of interconnections, which are formed over said one surface of the semiconductor substrate, each of the interconnections having a first end connected to one of the connection pads and a second end connected to one of the columnar external connection electrodes, such that each of the interconnections is positioned between and electrically connects one of the connection pads and one of the columnar external connection electrodes, and (iv) a sealing film which is provided around the columnar electrodes and which covers the interconnections and said one surface of the semiconductor substrate, wherein an upper surface of the sealing film is flush with upper surfaces of the columnar electrodes, an insulating layer which is formed on said first surface of the base plate and covers a peripheral surface of the semiconductor constructing body wherein an upper surface of the insulating layer is flush with the upper surface of the sealing film, a first upper insulating film which covers the entire upper surface of the insulating layer and an upper surface of the semiconductor constructing body except for a central portion of the upper surface of each of the columnar external connection electrodes, wherein the first upper insulating film has a flat upper surface, and wherein the first upper insulating film comprises a sheet of a build-up material or a prepreg material including a thermosetting resin which has been placed in a semi-set state on the upper surfaces of the insulating layer and the semiconductor constructing body and which has then been pressed and heated by a heating plate on an upper surface of the sheet so as to set the thermosetting resin and form the flat upper surface of the first upper insulating film, upper interconnections, each of which is formed on the first upper insulating film and over the insulating layer and includes at least one interconnection layer, at least some of the upper interconnections being connected to the external connection electrodes of the semiconductor constructing body and having at least one connection terminal portion, and lower interconnections, each of which is formed on a second surface of the base plate and includes at least one interconnection layer, at least some of the lower interconnections being electrically connected to the upper interconnections and having at least one connection terminal portion, wherein the semiconductor packages are connected to each other and stacked such that the at least one second semiconductor package is stacked on the first semiconductor package, and wherein the connection terminal portions of the lower interconnections of an upper one of the stacked semiconductor packages are connected to the connection terminal portions of the upper interconnections of a lower one of the semiconductor packages that is below the upper semiconductor package by one of: a connection portion between the first semiconductor package and the second semiconductor package stacked thereon, and a connection portion between a plurality of said second semiconductor packages stacked on each other.

33. A package according to claim 32, wherein the second semiconductor package comprises a vertical conducting portion which connects one of the interconnection layers of the upper interconnections to one of the interconnection layers of the lower interconnections.

34. A package according to claim 33, wherein the second semiconductor package has a through hole formed in the insulating layer and the base plate, and the vertical conducting portion includes at least an interconnection layer formed in the through hole.

35. A package according to claim 33, wherein the second semiconductor package has a through hole formed in the insulating layer and the base plate, and the vertical conducting portion includes at least a conductive material with which the through hole is filled.

36. A package according to claim 32, wherein the upper semiconductor package is bonded to the lower semiconductor package via an adhesive layer inserted therebetween.

37. A package according to claim 36, wherein the adhesive layer has through holes filled with a conductive material, and the connection terminal portions of the lower interconnections of the upper semiconductor package and the connection terminal portions of the upper interconnections of the lower semiconductor package are connected via the conductive material formed in the through holes.

38. A package according to claim 34, wherein each of the first semiconductor package and the second semiconductor package comprises a second upper insulating film which covers the upper surface of the first upper insulating film and the upper interconnections except the connection terminal portions of the upper interconnections.

39. A package according to claim 32, further comprising at least one projecting electrode which is formed on the connection terminal portion of at least one of the upper connections of an uppermost one of the stacked semiconductor packages.

40. A package according to claim 39, wherein the projecting electrode includes a solder ball.

41. A package according to claim 32, wherein the second semiconductor package comprises a lower insulating film which covers said second surface of the base plate and portions except the connection terminal portions of the lower interconnections.

* * * * *